United States Patent
Nakahara et al.

(10) Patent No.: US 9,252,162 B2
(45) Date of Patent: Feb. 2, 2016

(54) ACTIVE MATRIX SUBSTRATE

(71) Applicant: Sharp Kabushiki Kaisha, Osaka-shi, Osaka (JP)

(72) Inventors: Takahiro Nakahara, Osaka (JP); Hisashi Watanabe, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/358,308

(22) PCT Filed: Nov. 8, 2012

(86) PCT No.: PCT/JP2012/079010
§ 371 (c)(1),
(2) Date: May 15, 2014

(87) PCT Pub. No.: WO2013/077195
PCT Pub. Date: May 30, 2013

(65) Prior Publication Data
US 2014/0312354 A1    Oct. 23, 2014

(30) Foreign Application Priority Data
Nov. 22, 2011    (JP) .................................. 2011-255544

(51) Int. Cl.
*H01L 27/12* (2006.01)
*G02F 1/1335* (2006.01)
*G02F 1/1343* (2006.01)

(52) U.S. Cl.
CPC .......... *H01L 27/124* (2013.01); *G02F 1/13439* (2013.01); *G02F 1/133553* (2013.01); *G02F 1/134363* (2013.01)

(58) Field of Classification Search
None
See application file for complete search history.

(56) References Cited

U.S. PATENT DOCUMENTS

| | | | |
|---|---|---|---|
| 6,839,108 B1 * | 1/2005 | Hirakata et al. | 349/114 |
| 2002/0180919 A1 * | 12/2002 | Maeda et al. | 349/141 |
| 2003/0020854 A1 * | 1/2003 | Satake et al. | 349/113 |
| 2004/0174490 A1 * | 9/2004 | Satake | G02F 1/133553 349/178 |
| 2007/0126968 A1 | 6/2007 | Uochi | |
| 2011/0080545 A1 * | 4/2011 | Ohbayashi | 349/114 |

FOREIGN PATENT DOCUMENTS

| | | | |
|---|---|---|---|
| JP | 07294956 A | * | 11/1995 |
| JP | 2001-330844 A | | 11/2001 |
| JP | 2007-140492 A | | 6/2007 |
| JP | 2010-139920 A | | 6/2010 |
| JP | 2010-262055 A | | 11/2010 |

OTHER PUBLICATIONS

Official Communication issued in International Patent Application No. PCT/JP2012/079010, mailed on Dec. 4, 2012.

* cited by examiner

*Primary Examiner* — Khaja Ahmad
(74) *Attorney, Agent, or Firm* — Keating & Bennett, LLP

(57) ABSTRACT

The lateral electric field liquid crystal display device (1) includes a first insulating layer (5) that has at least one first reflection enhancing film layer which is made up of two films having respective different refractive indexes and being adjacent to each other. From this, it is possible to provide the lateral electric field liquid crystal display device (1) which can reflect incoming light at a reflectance higher than an original reflectance of a reflective electrode.

12 Claims, 15 Drawing Sheets

ACTIVE MATRIX SUBSTRATE

TECHNICAL FIELD

The present invention relates to a lateral electric field active matrix substrate which is included in a liquid crystal display device or the like.

BACKGROUND ART

In the field of liquid crystal display devices, it is demanded to secure a further brightness and a wider viewing angle characteristic in order to further enhance image quality.

In recent years, improvement in image quality of a liquid crystal display device has been achieved by some techniques. Among such techniques, a lateral electric field liquid crystal display device which utilizes a fringe-field switching (hereinafter, referred to as "FFS") is known to concurrently secure both a brighter display and a wide viewing angle characteristic.

Patent Literature 1 discloses a lateral electric field liquid crystal display device which is of a reflection type and utilizes FFS.

FIG. 15 is a view schematically illustrating a configuration of the lateral electric field liquid crystal display device of Patent Literature 1, which is of the reflection type and utilizes FFS.

As illustrated in FIG. 15, the lateral electric field liquid crystal display device includes a first substrate 101, a second substrate 102, and a liquid crystal layer 103 which is provided between the first substrate 101 and the second substrate 102.

Further, an alignment film 104 is provided between the first substrate 101 and the liquid crystal layer 103, and a second electrode 107 and an insulating film 108 are provided between the second substrate 102 and the liquid crystal layer 103 so as to be stacked in this order on an entire surface of the second substrate 102. On the insulating film 108, a plurality of first electrodes 106, each of which has a linear shape with a predetermined width W1, are provided at intervals L1, and an alignment film 105 is provided so as to cover the plurality of first electrodes 106 and the insulating film 108.

At least the second electrode 107 is formed by a reflective material. As illustrated in FIG. 15, therefore, incoming light 109 is to be reflected by the second electrode 107 in an area between the plurality of first electrodes 106 (i.e., in the area defined by the interval L1).

In a case where the plurality of first electrodes 106 are also formed by a reflective material, the incoming light 109 is to be reflected also by the plurality of first electrodes 106 in an area in which the plurality of first electrodes 106 are formed. Alternatively, in a case where each of the plurality of first electrodes 106 is a transparent electrode, the incoming light 109 is to be reflected by the second electrode 107 which is a reflective electrode provided under the plurality of first electrodes 106.

As such, Patent Literature 1 discloses that high display image quality can be achieved by the lateral electric field liquid crystal display device which is of the reflection type and utilizes FFS.

CITATION LIST

Patent Literature

[Patent Literature 1]
Japanese Patent Application Publication Tokukai No. 2001-330844 A (Publication date: Nov. 30, 2001)

SUMMARY OF INVENTION

Technical Problem

However, according to the lateral electric field liquid crystal display device of Patent Literature 1, which is of the reflection type and utilizes FFS, the insulating film 108 is a single-layer silicon oxide film (e.g., $SiO_2$) or a single-layer silicon nitride film (e.g., $SiN_x$), and such an insulating film 108 cannot achieve a sufficient reflectance.

The present invention is accomplished in view of the problem, and its object is to provide an active matrix substrate which can reflect incoming light at a reflectance higher than an original reflectance of a reflective electrode.

Solution to Problem

In order to attain the object, an active matrix substrate of the present invention includes: an insulating substrate; a first electrode provided on the insulating substrate; a first insulating layer formed so as to cover the first electrode; and a plurality of second electrodes provided on the first insulating layer, each of the plurality of second electrodes being a plurality of linear electrodes which are arranged at predetermined intervals and are electrically connected to each other, a lateral electric field being applied between the first electrode and the plurality of second electrodes, the first electrode being made of a material having an electrical conductivity and a reflectiveness, and each of the plurality of second electrodes being made of a material having an electrical conductivity, the first insulating layer including at least one first reflection enhancing layer which is made up of a first film and a second film which (i) have respective different refractive indexes, (ii) cause visible light to pass through, and (iii) are respective of a lower layer and an upper layer that are adjacent to each other, the lower layer being closer to the insulating substrate than the upper layer is, and in each of the at least one first reflection enhancing layer, the first film having a refractive index lower than a refractive index of the second film.

In order to attain the object, an active matrix substrate of the present invention includes: an insulating substrate; a first electrode provided on the insulating substrate; a first insulating layer formed so as to cover the first electrode; and a plurality of second electrodes provided on the first insulating layer, each of the plurality of second electrodes being a plurality of linear electrodes which are arranged at predetermined intervals and are electrically connected to each other, a lateral electric field being applied between the first electrode and the plurality of second electrodes, the first electrode and each of the plurality of second electrodes being made of a material having an electrical conductivity and a reflectiveness, a second insulating layer being formed at least in an area in which each of the plurality of second electrodes is provided, the second insulating layer including at least one second reflection enhancing layer which is made up of a third film and a fourth film which (i) have respective different refractive indexes, (ii) cause visible light to pass through, and (iii) are respective of a lower layer and an upper layer that are adjacent to each other, the lower layer being closer to the insulating substrate than the upper layer is, and in each of the at least one second reflection enhancing layer, the third film having a refractive index lower than a refractive index of the fourth film.

In order to attain the object, an active matrix substrate of the present invention includes: an insulating substrate; a first electrode provided on the insulating substrate; a first insulating layer formed so as to cover the first electrode; and a plurality of second electrodes provided on the first insulating layer, each of the plurality of second electrodes being a plurality of linear electrodes which are arranged at predetermined intervals and are electrically connected to each other, a lateral electric field being applied between the first electrode and the plurality of second electrodes, the first electrode being made of a material having an electrical conductivity and a reflectiveness, and each of the plurality of second electrodes being made of a material having an electrical conductivity and causing visible light to pass through, a third insulating layer being provided on each of the plurality of second electrodes as an upper layer or as a lower layer with respect to the second electrode, the third insulating layer causing visible light to pass through, the third insulating layer being made up of (i) a contact film that makes contact with the second electrode and (ii) at least one third reflection enhancing layer which is made up of two films that have respective different refractive indexes and are adjacent to each other; in a case where the third insulating layer is provided as the lower layer with respect to the second electrode, the second electrode being made of a material whose refractive index is higher than a refractive index of a material of the contact film that makes contact with the second electrode; and in a case where the third insulating layer is provided as the upper layer with respect to the second electrode, the second electrode being made of a material whose refractive index is lower than a refractive index of a material of the contact film that makes contact with the second electrode.

Advantageous Effects of Invention

According to the active matrix substrate of the present invention, as above described, the first electrode is made of a material having an electrical conductivity and a reflectiveness, and each of the plurality of second electrodes is made of a material having an electrical conductivity, the first insulating layer includes at least one first reflection enhancing layer which is made up of a first film and a second film which (i) have respective different refractive indexes, (ii) cause visible light to pass through, and (iii) are respective of a lower layer and an upper layer that are adjacent to each other, the lower layer is closer to the insulating substrate than the upper layer is, and in each of the at least one first reflection enhancing layer, the first film has a refractive index lower than a refractive index of the second film.

According to the active matrix substrate of the present invention, as above described, the first electrode and each of the plurality of second electrodes is made of a material having an electrical conductivity and a reflectiveness, a second insulating layer is formed at least in an area in which each of the plurality of second electrodes is provided; the second insulating layer includes at least one second reflection enhancing layer which is made up of a third film and a fourth film which (i) have respective different refractive indexes, (ii) cause visible light to pass through, and (iii) are respective of a lower layer and an upper layer that are adjacent to each other, the lower layer being closer to the insulating substrate than the upper layer is; and in each of the at least one second reflection enhancing layer, the third film has a refractive index lower than a refractive index of the fourth film.

Moreover, according to the active matrix substrate of the present invention, as above described, the first electrode is made of a material having an electrical conductivity and a reflectiveness, and each of the plurality of second electrodes being made of a material having an electrical conductivity and causing visible light to pass through, a third insulating layer being provided on each of the plurality of second electrodes as an upper layer or as a lower layer with respect to the second electrode, the third insulating layer causing visible light to pass through, the third insulating layer being made up of (i) a contact film that makes contact with the second electrode and (ii) at least one third reflection enhancing layer which is made up of two films that have respective different refractive indexes and are adjacent to each other; in a case where the third insulating layer is provided as the lower layer with respect to the second electrode, the second electrode being made of a material whose refractive index is higher than a refractive index of a material of the contact film that makes contact with the second electrode; and in a case where the third insulating layer is provided as the upper layer with respect to the second electrode, the second electrode being made of a material whose refractive index is lower than a refractive index of a material of the contact film that makes contact with the second electrode.

Therefore, it is possible to provide the active matrix substrate which can reflect incoming light at a reflectance higher than an original reflectance of a reflective electrode.

DESCRIPTION OF EMBODIMENTS

The following description will discuss detailed embodiments of the present invention with reference to drawings. Note, however, that the descriptions of dimensions, materials, and shapes of constituent members, and their relative locations etc. in the embodiments merely exemplify an embodiment of the present invention, and therefore should not be construed as limiting the scope of the invention only to them.

[Embodiment 1]

The following description will discuss Embodiment 1 of the present invention, with reference to FIGS. 1 through 4 and Tables 1 through 4.

Figure 1:
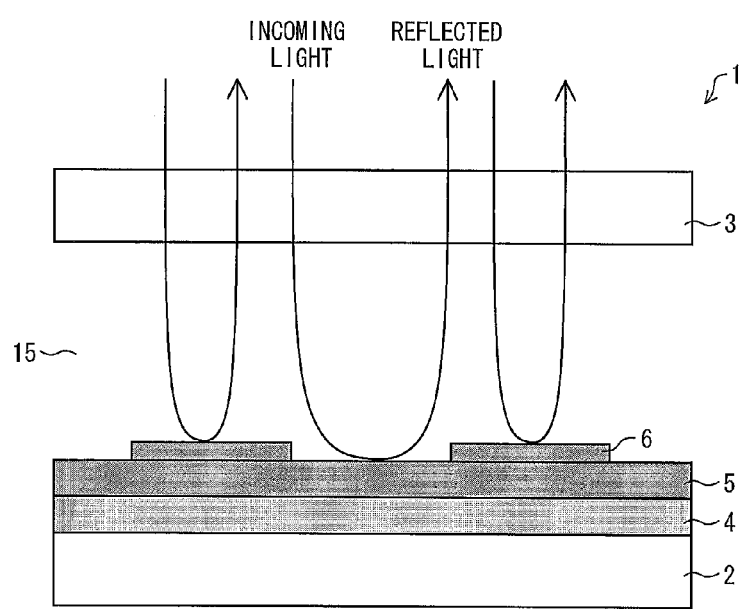
FIG. 1 is a view schematically illustrating a configuration of a lateral electric field liquid crystal display device which is of a reflection type and utilizes FFS, in accordance with an embodiment of the present invention.

FIG. 1 is a view schematically illustrating a configuration of a lateral electric field liquid crystal display device 1 which is of a reflection type and utilizes FFS.

The liquid crystal display device 1 includes an insulating substrate 2, a counter substrate 3, and a liquid crystal layer 15 which is provided between the insulating substrate 2 and the counter substrate 3 (see FIG. 1).

On the insulating substrate 2, a first electrode 4 is provided. On the first electrode 4, a first insulating layer 5 is provided so as to cover the first electrode 4. On the first insulating layer 5, a plurality of second electrodes 6 are provided.

Each of the plurality of second electrodes 6 is a plurality of linear electrodes which are arranged at predetermined intervals and are electrically connected with each other. A lateral electric field is to be applied between the first electrode 4 and the plurality of second electrodes 6.

Although not illustrated, a thin film transistor element (TFT element) for controlling each of the plurality of second electrodes 6 and an alignment film are provided on the insulating substrate 2.

The insulating substrate 2, on which the layers and the TFT elements are provided, serves as an active matrix substrate.

Meanwhile, a black matrix layer, a color filter layer, an alignment film, and the like (which are not illustrated) are provided between the counter substrate 3 and the liquid crystal layer 15.

The insulating substrate 2 and the counter substrate 3 are not limited to particular ones, provided that each of the insulating substrate 2 and the counter substrate 3 is made of a highly transparent material. In the present embodiment, each of the insulating substrate 2 and the counter substrate 3 is a glass substrate.

The first electrode 4 is a reflective electrode and can be made of, for example, a reflective material such as Ag, Al, or Au. In the present embodiment, the first electrode 4 is made of Al.

The second electrode 6 can be either a reflective electrode which is made of a reflective material such as Ag, Al, or Au or a transparent electrode which is made of a material such as ITO (Indium Tin Oxide) or IZO (Indium Zinc Oxide). In the present embodiment, the second electrode 6 is made of Al.

Figure 2:
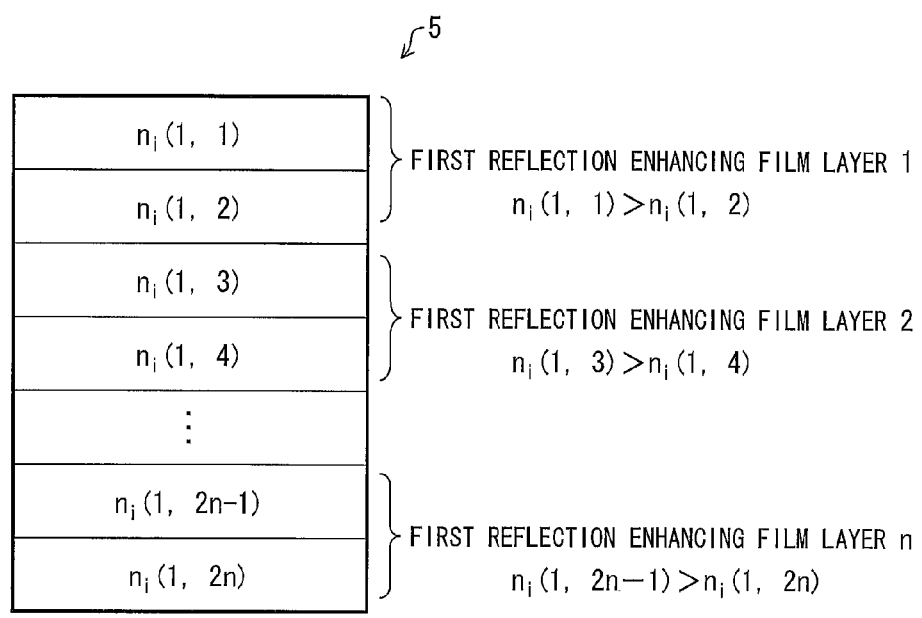
FIG. 2 is a cross-sectional view of a first insulating layer that has a plurality of first reflection enhancing film layers which are used in a lateral electric field liquid crystal display device, in accordance with an embodiment of the present invention.

The following description will discuss the first insulating layer 5 with reference to FIG. 2.

FIG. 2 is a cross-sectional view of the first insulating layer 5 that has a plurality of first reflection enhancing film layers which are used in the lateral electric field liquid crystal display device 1.

The first insulating layer 5 has at least one first reflection enhancing film layer that is made up of two films which have respective different refractive indexes and are adjacent to each other (see FIG. 2).

In FIG. 2, each of the refractive indexes of the respective layers constituting the first insulating layer 5 is indicated by $n_i(a, b)$, where "i" indicates an insulating film (insulator) and "a" indicates a numeral of the insulating film. For example, "a" of insulating films in the first insulating layer 5 is "1".

Moreover, "b" indicates a location of the insulating film and, for example, "b" of an insulating film in a second layer is "2".

As such, a value of "b" increases like 1, 2, ... 2n−1, and 2n from an uppermost film to a lowermost film in the first insulating layer 5.

Moreover, "n" is a natural number indicative of the number of the first reflection enhancing film layers.

The first reflection enhancing film layers 1, ... and n of the first insulating layer 5 are made up of (i) respective first films which are lower layers and (ii) respective second films which are upper layers. Each of the first films and the second films causes visible light to pass through. The first films have respective refractive indexes $n_i(1, 2)$, $n_i(1, 4)$, ... and $n_i(1, 2n)$ which are lower than respective refractive indexes $n_i(1, 1)$, $n_i(1, 3)$, ... and $n_i(1, 2n−1)$ of the second films.

That is, in each of the first reflection enhancing film layers 1, ... and n, a relation between the refractive index of the second film and the refractive index of the first film is $n_i(1, 2n−1) > n_i(1, 2n)$.

For example, in the first reflection enhancing film layer 1 which is provided uppermost in the first insulating layer 5, a relation between the refractive index of the second film and the refractive index of the first film is $n_i(1, 1) > n_i(1, 2)$.

From this, for example, in a case where a refractive index $n_i(1, 2n−1)$ of a second film is 2, a refractive index $n_i(1, 2n)$ of a first film can be 1.5.

A material of the first film and the second film which constitute each of the first reflection enhancing film layers 1, ... and n of the first insulating layer 5 is not limited to a particular one, provided that the above described relation of refractive indexes is satisfied and the material causes visible light to pass through. Each of the first film and the second film can be, for example, an inorganic insulating film such as a silicon oxide film, a silicon nitride film, or a silicon nitride oxide film or an organic insulating film having a low refractive index (e.g., OPTMER TU2276 having a refractive index of 1.33 (manufactured by JSR Corporation)); or an organic insulating film such as an organic insulating film having a high refractive index (e.g., OPTMER KZ6661 having a refractive index of 1.65 (manufactured by JSR Corporation)) or an acrylic organic insulating film having a high refractive index.

It is preferable that the first film and the second film that constitute each of the first reflection enhancing film layers 1, . . . and n of the first insulating layer 5 do not have a birefringence. This is because, in a case of having a birefringence, a transmittance is decreased and consequently a reflectance is decreased.

Each of the first reflection enhancing film layers of the first insulating layer 5 illustrated in FIG. 2 serves as a reflection enhancing film layer by combining light, which is reflected from a surface of the second film that is an upper layer, with light reflected from a boundary surface between the second film and the first film which is a lower layer located closer to the insulating substrate 2 than the second film (i.e., upper layer) is. The first insulating layer 5 is made up of 2n layers and includes the first reflection enhancing film layers 1, 2, . . . and n, and it is therefore possible to further improve the reflection enhancing effect.

In the first reflection enhancing film layers of the first insulating layer 5 illustrated in FIG. 2, it is preferable that the first films are made of an identical material, and the second films are made of another identical material which is different from the material of the first films.

For example, it is possible that all the second films in the first insulating layer 5 are made of SiNx that has a refractive index $n_r(1, 2n-1)$ of 2.03 (for 550 nm), and all the first films in the first insulating layer 5 are made of $SiO_2$ that has a refractive index $n_r(1, 2n)$ of 1.47 (for 550 nm).

This allows the first insulating layer 5 to be formed by repeatedly carrying out a formation of an SiNx film and a formation of an $SiO_2$ film. As such, it is possible to form the first insulating layer 5 which includes a plurality of layers, i.e., the first reflection enhancing film layers 1, 2, . . . and n relatively easily and at low cost.

Figure 3:
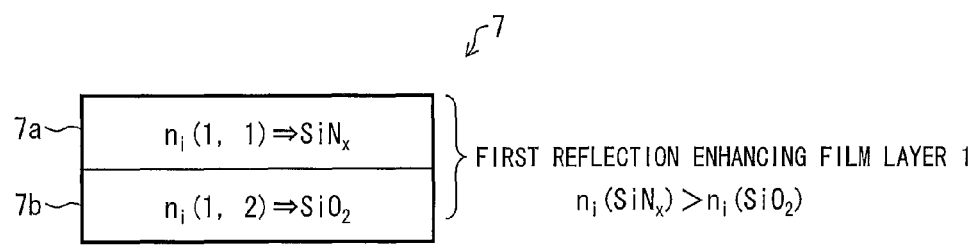
FIG. 3 is a view illustrating an example of a first insulating layer that has one (1) first reflection enhancing film layer which is used in a lateral electric field liquid crystal display device, in accordance with an embodiment of the present invention.

FIG. 3 is a view illustrating an example of a first insulating layer that has one (1) first reflection enhancing film layer which is used in the lateral electric field liquid crystal display device 1.

The first insulating layer 7 includes a second film 7a which is an upper layer and a first film 7b which is a lower layer, and the second film 7a and the first film 7b constitute a first reflection enhancing film layer 1 (see FIG. 3).

The first film 7b is made of $SiO_2$ that has a refractive index $n_r(1, 2)$ of 1.47 (for 550 nm), and the second film 7a is made of SiNx that has a refractive index $n_r(1, 1)$ of 2.03 (for 550 nm).

Figure 4:
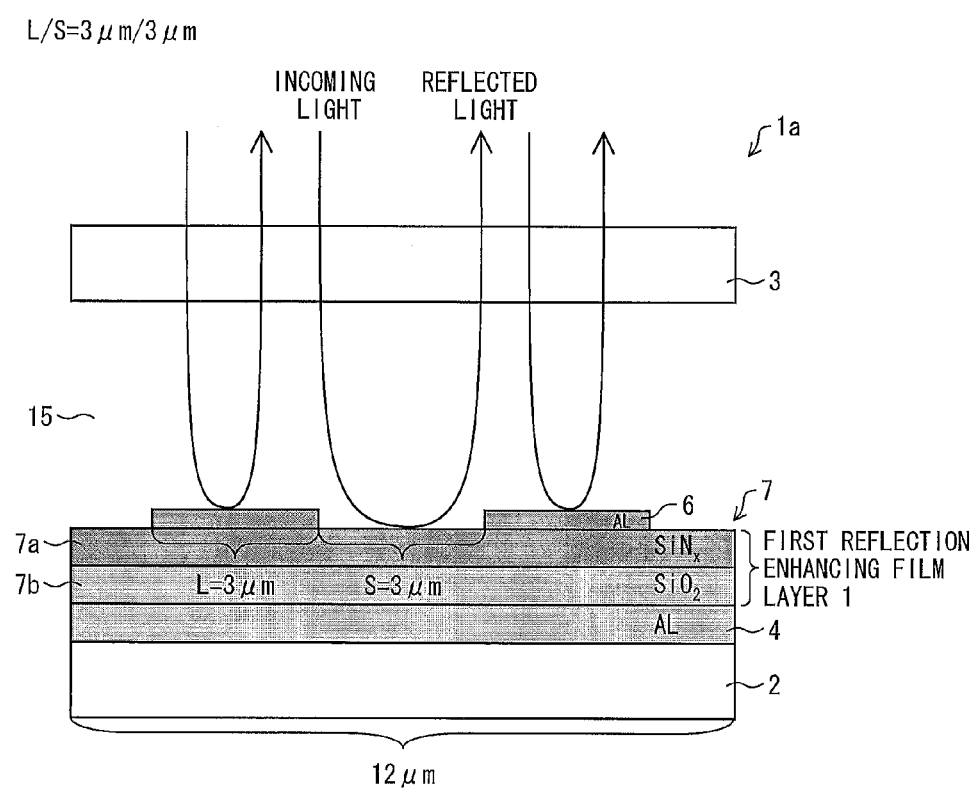
FIG. 4 is a view schematically illustrating a configuration of another lateral electric field liquid crystal display device that has a first insulating layer, in accordance with an embodiment of the present invention.

FIG. 4 is a view schematically illustrating a configuration of a lateral electric field liquid crystal display device 1a which is of a reflection type, utilizes FFS, and has the first insulating layer 7.

The lateral electric field liquid crystal display device 1a is designed such that a width L of a second electrode 6 is 3 μm, a space S between second electrodes 6 is 3 μm, and a width of an entire pixel is 12 μm (see FIG. 4).

According to the lateral electric field liquid crystal display device 1a, both the first electrode 4 and the second electrode 6 are made of Al.

The following description will discuss optimal film thicknesses of the first film 7b and the second film 7a in the first insulating layer 7, which are calculated with the use of the lateral electric field liquid crystal display device 1a configured as illustrated in FIG. 4.

In FIG. 4, a reflectance of an area (L) in which the second electrode 6 is formed is different from a reflectance of an area (S) in which the first insulating layer 7 is formed. Therefore, the optimal film thickness needs to be calculated for each of the areas (L) and (S).

First, optimal thicknesses, with which most preferable reflectance and chromaticity can be achieved, of respective of the first film 7b and the second film 7a in the area (S) are calculated.

Note that "λ/4" is an optical film thickness and is indicated by a product nd of a refractive index n and a film thickness d. "λ" is a setting wavelength and is assumed to be 550 nm in the calculation. By changing the optical film thickness by modulating values a and b, optimal reflectance and chromaticity are calculated.

Tables 1, 2, and 3 blow indicate optimal film thicknesses with which most preferable reflectance and chromaticity can be obtained, in a case where the first film 7b is formed by $SiO_2$ that has a refractive index of 1.47 (for 550 nm) and the second film 7a is formed by SiNx that has a refractive index of 2.03 (for 550 nm).

TABLE 1

| | | a | | | | |
|---|---|---|---|---|---|---|
| | | $SiO_2$ (λ/4 × a) | | | | |
| *Refl. (%) | b | 0 | 0.3 | 0.6 | 0.9 | 1.2 |
| SiNx | 0 | 88.51% | 88.66% | 88.84% | 88.91% | 88.82% |
| (λ/4 × b) | 0.3 | 86.11% | 85.62% | 88.24% | 90.53% | 91.27% |
| | 0.6 | 82.25% | 85.36% | 90.39% | 92.61% | 92.63% |
| | 0.9 | 81.06% | 88.13% | 92.38% | 93.56% | 92.57% |
| | 1.2 | 84.19% | 90.45% | 93.07% | 93.26% | 91.17% |

*Refl.: Reflectance

TABLE 2

| | | a | | | | |
|---|---|---|---|---|---|---|
| | | $SiO_2$ (λ/4 × a) | | | | |
| *xy C.C. | b | 0 | 0.3 | 0.6 | 0.9 | 1.2 |
| SiNx | 0 | 0.3111/0.3284 | 0.3111/0.3284 | 0.3112/0.3285 | 0.3113/0.3287 | 0.3114/0.3287 |
| (λ/4 × b) | 0.3 | 0.3124/0.3299 | 0.3106/0.3276 | 0.3086/0.326 | 0.3094/0.3272 | 0.3115/0.3296 |
| | 0.6 | 0.3219/0.3298 | 0.3067/0.324 | 0.3077/0.3259 | 0.3102/0.3283 | 0.3136/0.3323 |
| | 0.9 | 0.3074/0.3239 | 0.3061/0.3247 | 0.3092/0.3276 | 0.3121/0.3303 | 0.317/0.3365 |
| | 1.2 | 0.3051/0.3237 | 0.3084/0.3272 | 0.3115/0.3298 | 0.3146/0.3331 | 0.3192/0.3371 |

*xy C.C.: xy chromaticity coordinates

TABLE 3

| Δxy (Al Center) | b | a SiO$_2$ (λ/4 × a) | | | | |
|---|---|---|---|---|---|---|
| | | 0 | 0.3 | 0.6 | 0.9 | 1.2 |
| SiNx (λ/4 × b) | 0 | 0.00000 | 0.00000 | 0.00014 | 0.00036 | 0.00042 |
| | 0.3 | 0.00198 | 0.00094 | 0.00347 | 0.00208 | 0.00126 |
| | 0.6 | 0.01089 | 0.00622 | 0.00422 | 0.00091 | 0.00463 |
| | 0.9 | 0.00583 | 0.00622 | 0.00206 | 0.00215 | 0.01002 |
| | 1.2 | 0.00762 | 0.00295 | 0.00146 | 0.00586 | 0.01189 |

Each of the values a and b in the above tables indicates a magnification of a λ/4 wavelength.

Table 1 indicates values of reflectance (%). Table 2 indicates values of xy chromaticity coordinates. Table 3 indicates Δxy chromaticity differences from xy coordinates (x=0.3111, y=0.3284) of a simple substance Al.

An optimal range of the values a and b obtained based on Tables 1 through 3 can be 0.3 (280 Å)<a<1.2 (1100 Å), and 0.3 (200 Å)<b<1.2 (810 Å), preferably 0.6 (560 Å)<a<1.2 (1100 Å) and 0.6 (410 Å)<b<1.2 (810 Å), more preferably a=0.9 (840 Å) and b=0.9 (610 Å).

From this, it is preferable that the first film 7b made of SiO$_2$ has a film thickness of 280 Å or more and 1100 Å or less, and the second film 7a made of SiNx has a film thickness of 200 Å or more and 810 Å or less.

Next, a reflectance in the area (L) in which the second electrode 6 is formed is 88.51%, because the reflectance in the case of the simple substance Al is 88.51%.

Table 4 below indicates (i) a reflectance of the entire pixel illustrated in FIG. 4 calculated based on the above results and (ii) a reflectance of the entire pixel calculated in a case where the plurality of first reflection enhancing film layers 1 illustrated in FIG. 4 are provided.

TABLE 4

| | L-reflectance | S-reflectance | Reflectance of entire pixel | Reflection enhancing ratio (%) | Δxy chromaticity difference of S |
|---|---|---|---|---|---|
| No first reflection enhancing layer | 88.51% | 88.91% | 88.71% | — | 0.00036 |
| SiO$_2$ only (a = 0.9) | | | | | |
| 1 first reflection enhancing layer (SiO$_2$ + SiNx) (a = 0.9, b = 0.9) | 88.51% | 93.56% | 91.03% | 2.6 | 0.00215 |
| 2 first reflection enhancing layers (SiO$_2$ + SiNx) (a = 0.9, b = 0.9) | 88.51% | 95.86% | 92.18% | 3.9 | 0.00331 |
| 3 first reflection enhancing layers (SiO$_2$ + SiNx) (a = 0.9, b = 0.9) | 88.51% | 96.57% | 92.54% | 4.3 | 0.00503 |

An upper left value (i.e., a=0, b=0) in each of Tables 1, 2, and 3 corresponds to a case in which an SiO$_2$ film and an SiNx film are not provided (i.e., the first insulating layer 7 is not provided), that is, the upper left value corresponds to a case of the simple substance Al. As is indicated in Table 1, a reflectance in the case of the simple substance Al is 88.51%.

Meanwhile, in a case where a is 0.9 (i.e., 840 Å) and b is 0.9 (i.e., 610 Å), that is, in a case where the SiO$_2$ film has a film thickness of 840 Å and the SiNx film has a film thickness of 610 Å, a reflectance is 93.56%, i.e., improved by approximately 6%.

Table 3 shows that, in a case where a is 0.9 (i.e., 840 Å) and b is 0.9 (i.e., 610 Å), that is, in a case where the SiO$_2$ film has a film thickness of 840 Å and the SiNx film has a film thickness of 610 Å, a difference Δxy is 0.00215, which is relatively smaller as compared with another film thickness configuration with which a similar reflectance (e.g., 93.26%) can be obtained.

Therefore, a condition in which a is 0.9 (840 Å) and b is 0.9 (610 Å) is the optimal film thickness condition with which a highest reflectance can be obtained and the color shift from the simple substance Al is smallest.

In any of cases shown in Table 4, an L-reflectance, which is a reflectance in the area, in which the second electrode 6 is provided, is 88.51% because the second electrode 6 is the simple substance Al.

Meanwhile, an S-reflectance, which is a reflectance in a space between the second electrodes 6, varies depending on whether or not a first reflection enhancing film layer is provided or on the number of provided first reflection enhancing film layers (see Table 4).

According to Table 4, in a case where no first reflection enhancing film layer is provided, i.e., only an SiO$_2$ film having a film thickness of 840 Å (a=0.9) is provided, the S-reflectance is 88.91%. In a case where one (1) first reflection enhancing film layer is provided, i.e., an SiO$_2$ film having a film thickness of 840 Å (a=0.9) and an SiNx film having a film thickness of 610 Å (b=0.9) are provided, the S-reflectance is 93.56%.

In a case where the reflectance of the entire pixel is calculated from the S-reflectance above obtained, the reflectance of the entire pixel is 88.71% in the case where no first reflection enhancing film layer is provided, and the reflectance of the entire pixel is 91.03% in the case where one (1) first reflection enhancing film layer is provided. As such, by providing the one (1) first reflection enhancing film layer, the reflectance of the entire pixel is improved by approximately 2.6%.

Moreover, in a case where the number of first reflection enhancing film layers, each of which is made up of an SiO$_2$ film having a film thickness of 840 Å (a=0.9) and an SiNx film having a film thickness of 610 Å (b=0.9), is increased to two and three, the reflectance of the entire pixel is further improved to 92.18% and 92.54%, respectively (see Table 4).

Concurrently, although the color shift from Al is increased, the increase is not so large as to cause a problem.

[Embodiment 2]

The following description will discuss Embodiment 2 of the present invention with reference to FIGS. 5 through 8 and Table 5. The present embodiment is different from Embodiment 1 in that a second electrode 6 is made up of a reflective electrode and, in an area in which the second electrode 6 is provided, a second insulating layer 8 is provided which includes at least one second reflection enhancing film layer that is made up of two films (i.e., a third film and a fourth film) having respective different refractive indexes and being adjacent to each other. Each of the third film and the fourth film causes visible light to pass through. The third film is a lower layer which is closer to the insulating substrate 2 than the fourth film (i.e., an upper layer) is, and the third film has a refractive index lower than that of the fourth film. The other configurations are identical with those described in Embodiment 1. For convenience, identical reference numerals are given to constituent members having functions identical with those of the constituent members illustrated in the drawings of Embodiment 1, and descriptions of such constituent members are omitted here.

Figure 5:
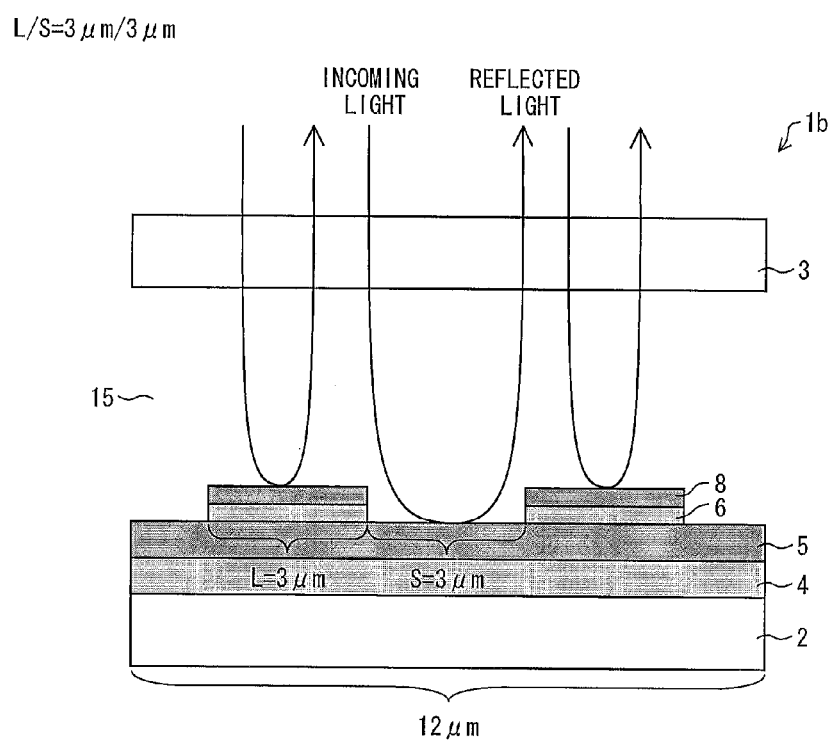
FIG. 5 is a view schematically illustrating a configuration of a lateral electric field liquid crystal display device, in accordance with another embodiment of the present invention.

FIG. 5 is a view schematically illustrating a configuration of a lateral electric field liquid crystal display device 1b which is of a reflection type, utilizes FFS, and includes at least a second insulating layer 8 provided in the area in which the second electrode 6 made up of a reflective electrode is formed. The second insulating layer 8 includes at least one second reflection enhancing film layer that is made up of two films (i.e., a third film and a fourth film) having respective different refractive indexes and being adjacent to each other. Each of the third film and the fourth film causes visible light to pass through. The third film is a lower layer which is closer to the insulating substrate 2 than the fourth film (i.e., an upper layer) is, and the third film has a refractive index lower than that of the fourth film.

Figure 6:
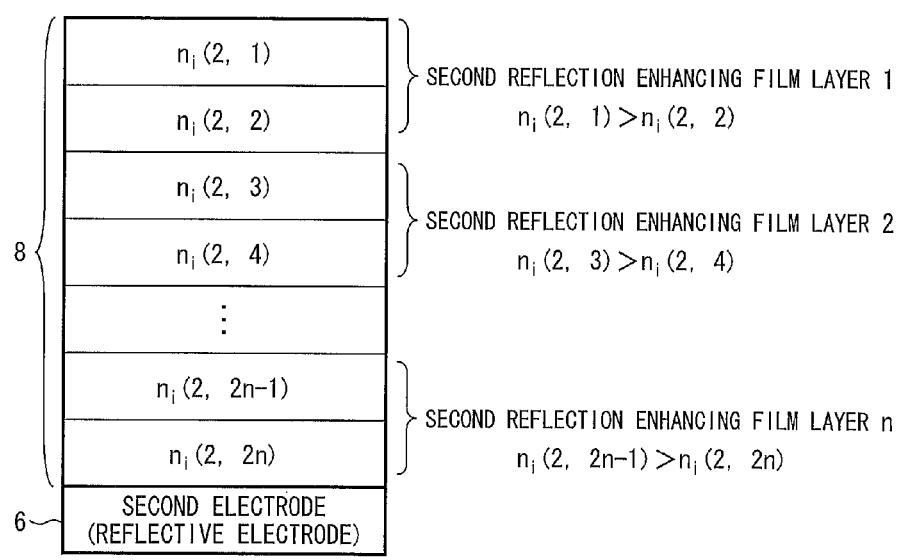
FIG. 6 is a cross-sectional view of a second insulating layer that has a plurality of second reflection enhancing film layers which are used in a lateral electric field liquid crystal display device, in accordance with another embodiment of the present invention.

FIG. 6 is a cross-sectional view of the second insulating layer 8 that has a plurality of second reflection enhancing film layers which are used in the lateral electric field liquid crystal display device 1b.

The second insulating layer 8, which is at least provided in the area in which the second electrode 6 made up of a reflective electrode is formed, includes at least one second reflection enhancing film layer that is made up of two films having respective different refractive indexes and being adjacent to each other.

In the second reflection enhancing film layers 1, . . . and n of the second insulating layer 8, third films, each of which is the lower layer and causes visible light to pass through, have respective refractive indexes $n_t(2, 2)$, $n_t(2, 4)$, . . . and $n_t(2, 2n)$ which are lower than respective refractive indexes $n_t(2, 1)$, $n_t(2, 3)$, . . . and $n_t(2, 2n-1)$ of the fourth films each of which is an upper layer and causes visible light to pass through.

That is, in each of the second reflection enhancing film layers 1, . . . and n, a relation between the refractive index of the fourth film and the refractive index of the third film is $n_t(2, 2n-1) > n_t(2, 2n)$.

For example, in the second reflection enhancing film layer 1 which is provided uppermost in the first insulating layer 8, a relation between the refractive index of the fourth film and the refractive index of the third film is $n_t(2, 1) > n_t(2, 2)$.

From this, for example, in a case where a refractive index $n_t(1, 2n-1)$ of a fourth film is 2, a refractive index $n_t(1, 2n)$ of a third film can be 1.5.

Each of the third film and the fourth film, which constitute each of the second reflection enhancing film layers 1, . . . and n of the second insulating layer 8, can be formed by a material identical with that of the first film and the second film which constitute each of the first reflection enhancing film layers 1, . . . and n of the first insulating layer 5 which has been described in Embodiment 1.

Each of the second reflection enhancing film layers of the second insulating layer 8 illustrated in FIG. 6 serves as a reflection enhancing layer by combining light, which is reflected from a surface of the fourth film that is the upper layer, with light reflected from a boundary surface between the fourth film and the third film which is the lower layer. The second insulating layer 8 is made up of 2n layers and includes the second reflection enhancing film layers 1, 2, . . . and n, and it is therefore possible to further improve the reflection enhancing effect.

In the second reflection enhancing film layers of the second insulating layer 8 illustrated in FIG. 6, it is preferable the third films are made of an identical material, and the fourth films are made of another identical material which is different from the material of the third films.

For example, it is possible that all the fourth films in the second insulating layer 8 are made of SiNx that has a refractive index $n_t(1, 2n-1)$ of 2.03 (for 550 nm), and all the third films in the second insulating layer 8 are made of SiO$_2$ that has a refractive index $n_t(1, 2n)$ of 1.47 (for 550 nm).

This allows the second insulating layer 8 to be formed by repeatedly carrying out a formation of an SiNx film and a formation of an SiO$_2$ film. As such, it is possible to form the second insulating layer 8 which includes a plurality of layers, i.e., the second reflection enhancing film layers 1, 2, . . . and n relatively easily and at low cost.

The lateral electric field liquid crystal display device 1b illustrated in FIG. 5 includes both the first insulating layer 5 which has been described in Embodiment 1 and the second insulating layer 8. It is therefore possible to provide the lateral electric field liquid crystal display device 1b which has a higher reflectance, by utilizing effects of the first reflection enhancing film layers 1, 2, . . . and n and of the second reflection enhancing film layers 1, 2, . . . and n.

Figure 7:
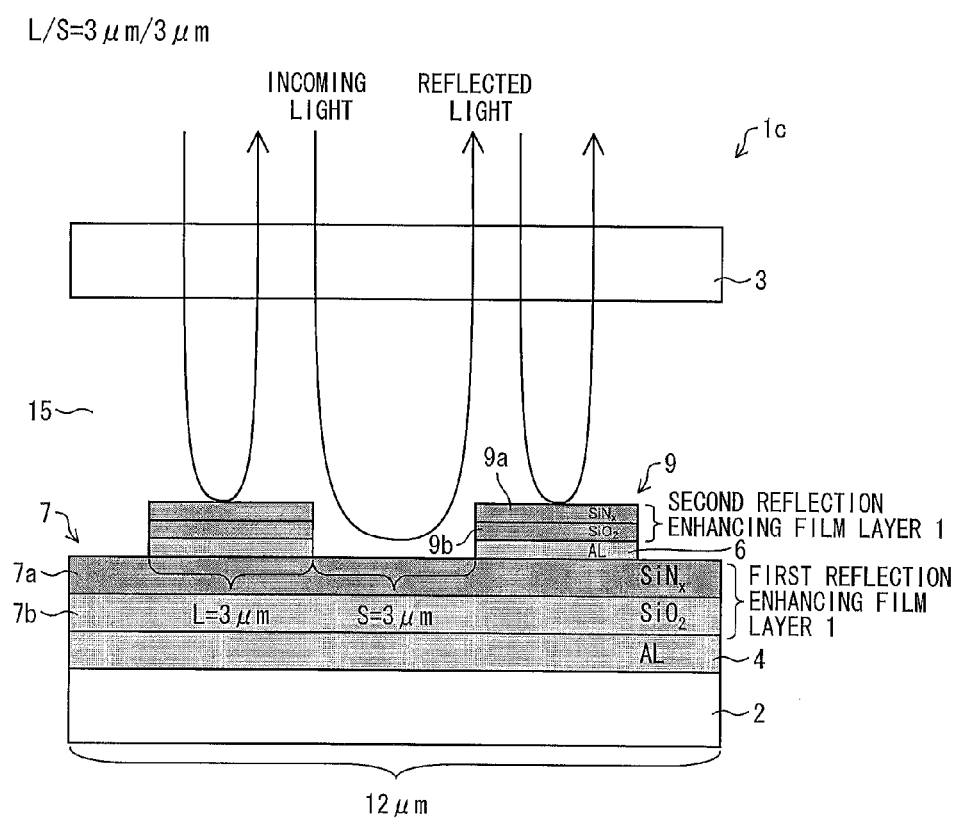
FIG. 7 is a view schematically illustrating a configuration of a lateral electric field liquid crystal display device which includes (i) a first insulating layer having one (1) first reflection enhancing film layer illustrated in FIG. 3 and (ii) a second insulating layer having one (1) second reflection enhancing film layer, in accordance with another embodiment of the present invention.

FIG. 7 is a view schematically illustrating a configuration of a lateral electric field liquid crystal display device 1c which includes (i) a first insulating layer 7 having one (1) first reflection enhancing film layer illustrated in FIG. 3 and (ii) a second insulating layer 9 having one (1) second reflection enhancing film layer.

The first insulating layer 7 has already been explained in Embodiment 1 and the explanation is not repeated here. The following describes only the second insulating layer 9.

The second insulating layer 9 includes a fourth film 9a (i.e., upper layer) and a third film 9b (i.e., lower layer), and the fourth film 9a and the third film 9b constitute a second reflection enhancing film layer 1 (see FIG. 7).

The third film 9b is formed by SiO$_2$ that has a refractive index of 1.47 (for 550 nm), and the fourth film 9a is formed by SiNx that has a refractive index of 2.03 (for 550 nm).

Each of FIGS. 5 and 7 illustrates the configuration in which the second insulating layer 8 or the second insulating layer 9 is formed only in an area in which the second electrode 6 (i.e., reflective electrode) is formed. Note, however, that each of the second insulating layer 8 and the second insulating layer 9 can be formed in an entire surface area, and such a configuration makes it possible to increase reflectance in an area other than the area in which the second electrode 6 is formed.

Table 5 below shows (i) a result of calculated reflectance of an entire pixel of the lateral electric field liquid crystal display device 1c which is configured as illustrated in FIG. 7 and (ii) a result of calculated reflectance of an entire pixel in each case where a plurality of first reflection enhancing film layers 1 of FIG. 7 and a plurality of second reflection enhancing film layers 1 of FIG. 7 are provided.

TABLE 5

|  | L-reflectance | S-reflectance | Reflectance of entire pixel | Reflection enhancing ratio (%) | Entire Δxy chromaticity difference |
|---|---|---|---|---|---|
| No first and second reflection enhancing layer SiO$_2$ only (a = 0.9) | 88.91% | 88.91% | 88.91% | — | 0.00036 |
| 1 first and 1 second reflection enhancing layers (SiO$_2$ + SiNx) (a = 0.9, b = 0.9) | 93.56% | 93.56% | 93.56% | 5.5 | 0.00215 |
| 2 first and 2 second reflection enhancing layers (SiO$_2$ + SiNx) (a = 0.9, b = 0.9) | 95.86% | 95.86% | 95.86% | 8.1 | 0.00331 |
| 3 first and 3 second reflection enhancing layers (SiO$_2$ + SiNx) (a = 0.9, b = 0.9) | 96.57% | 96.57% | 96.57% | 8.9 | 0.00503 |

Note that a reflectance of an area (S) in which the first insulating layer 7 is formed can be obtained in the manner already described in Embodiment 1. A reflectance of an area (L) in which the second electrode 6 is formed is obtained in a manner different from that of Embodiment 1 because the second reflection enhancing film layer is provided on the second electrode 6.

Specifically, an L-reflectance, which is the reflectance of the area (L), varies depending on whether or not the second reflection enhancing film layer is provided or on the number of provided second reflection enhancing film layers.

According to Table 5, in a case where the first reflection enhancing film layer and the second reflection enhancing film layer are not provided, i.e., only an SiO$_2$ film having a film thickness of 840 Å(a=0.9) is provided on each of the first electrode 4 and the second electrode 6, both the L-reflectance and the S-reflectance are 88.91%. In a case where one (1) first reflection enhancing film layer and one (1) second reflection enhancing film layer are provided, i.e., an SiO$_2$ film having a film thickness of 840 Å(a=0.9) and an SiNx film having a film thickness of 610 Å(b=0.9) are provided on each of the first electrode 4 and the second electrode 6, both the L-reflectance and the S-reflectance are 93.56%.

In a case where the reflectance of the entire pixel is calculated from the L-reflectance and the S-reflectance above obtained, the reflectance of the entire pixel is 88.91% in the case where the first reflection enhancing film layer and the second reflection enhancing film layer are not provided, and the reflectance of the entire pixel is 93.56% in the case where one (1) first reflection enhancing film layer and one (1) second reflection enhancing film layer are provided. As such, by providing the one (1) first reflection enhancing film layer and the one (1) second reflection enhancing film layer, the reflectance of the entire pixel is improved by approximately 5.5%.

Moreover, in a case where each of the number of first reflection enhancing film layers and the number of second reflection enhancing film layers, each of which is made up of the SiO$_2$ film having a film thickness of 840 Å(a=0.9) and the SiNx film having a film thickness of 610 Å(b=0.9), is increased to two and three, the reflectance of the entire pixel is further improved to 95.86% and 96.57%, respectively (see Table 5).

Concurrently, although the color shift from Al is increased, the increase is not so large as to cause a problem.

Note that, as shown in Tables 4 and 5, in a case where only the SiO$_2$ film is provided on the second electrode 6 (i.e., Al electrode), the reflectance (i.e., L-reflectance) is 88.91%, which is higher than the reflectance 88.51% of a case of only the second electrode 6 (i.e., Al electrode).

This is because a refractive index of the liquid crystal layer 15 is assumed to be 1.5 in the calculation.

Specifically, the reflectance (i.e., L-reflectance) of the case in which only the SiO$_2$ film is provided on the second electrode 6 (i.e., Al electrode) is higher than the reflectance of the case in which only the second electrode 6 (i.e., Al electrode) is provided, because the reflection enhancing film layer is made up of the SiO$_2$ film (having a refractive index of 1.47) and the liquid crystal layer 15 (having a refractive index of 1.5).

On the other hand, in a case where only an SiNx film (having a refractive index of 2.31) is provided on the second electrode 6 (i.e., Al electrode) instead of the SiO$_2$ film, the reflectance (i.e., L-reflectance) is smaller, that is, 81.06% because the refractive index of the liquid crystal layer 15 is lower than that of the SiNx film and accordingly the SiNx film and the liquid crystal layer 15 cannot serve as a reflection enhancing film layer.

Under the circumstances, in a case where an alignment film which has a refractive index lower than that of the liquid crystal layer 15 is provided on the liquid crystal layer 15 in addition to the first reflection enhancing film layer and the second reflection enhancing film layer, it is possible to further provide a reflection enhancing film layer which is made up of the alignment film and the liquid crystal layer 15.

Figure 8:
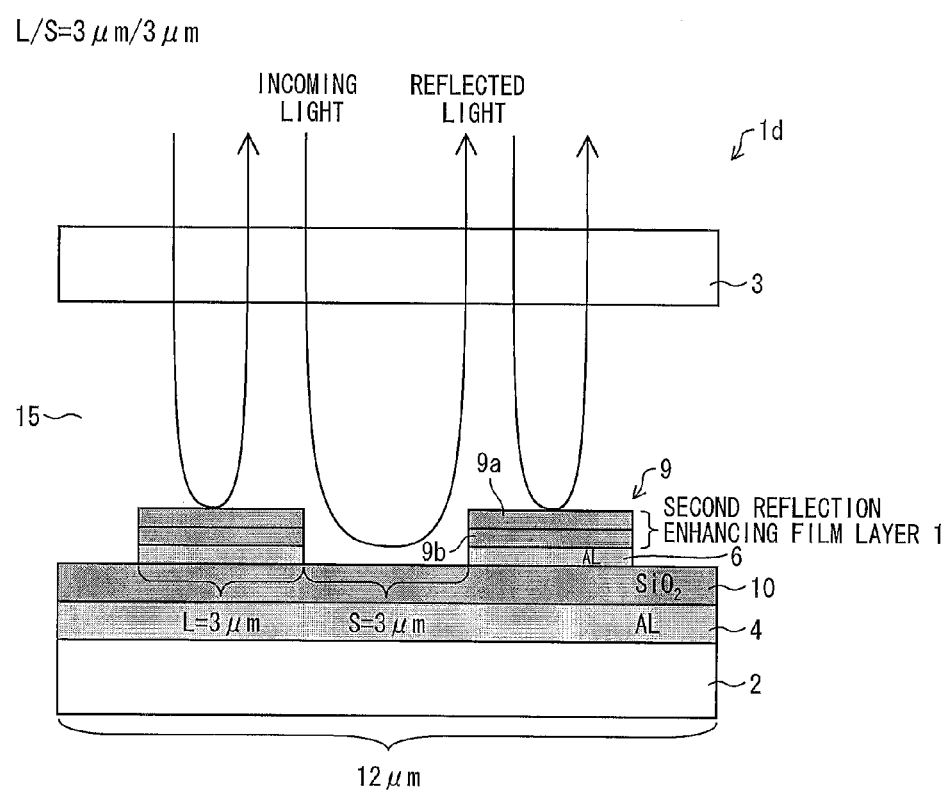
FIG. 8 is a view illustrating an example of a lateral electric field liquid crystal display device which includes an insulating layer made up of one (1) $SiO_2$ film, in accordance with another embodiment of the present invention.

Note that a lateral electric field liquid crystal display device 1d illustrated in FIG. 8 is different from the lateral electric field liquid crystal display device 1c illustrated in FIG. 7 in that an insulating layer 10, which is made up of one (1) SiO$_2$ film, is provided on the first electrode 4 instead of the first insulating layer 5.

The lateral electric field liquid crystal display device 1d illustrated in FIG. 8 can also achieve the reflection enhancing effect by a second insulating layer 9 which is provided on the second electrode 6.

[Embodiment 3]

The following description will discuss Embodiment 3 of the present invention with reference to FIGS. 9 through 13 and Tables 6 through 12. The present embodiment is different from Embodiments 1 and 2 in that a third reflection enhancing film layer is provided which includes a second electrode 12 that is a transparent electrode made of a material such as ITO. The other configurations are identical with those described in Embodiments 1 and 2. For convenience, identical reference numerals are given to constituent members having functions identical with those of the constituent members illustrated in the drawings of Embodiments 1 and 2, and descriptions of such constituent members are omitted here.

Figure 9:
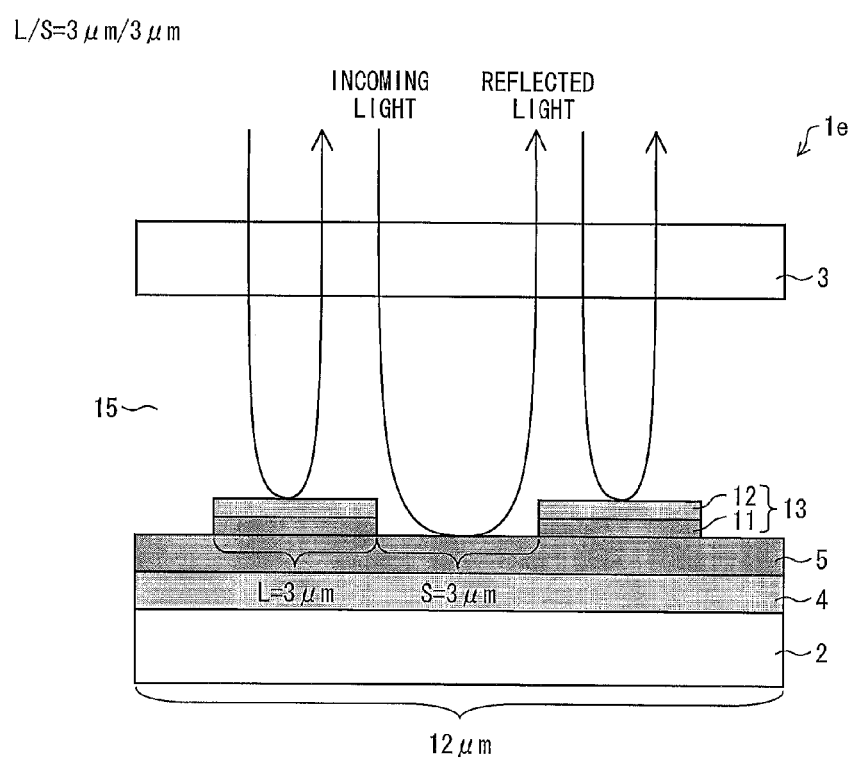
FIG. 9 is a view schematically illustrating a configuration of a lateral electric field liquid crystal display device, in accordance with still another embodiment of the present invention.

A lateral electric field liquid crystal display device 1e illustrated in FIG. 9 has a configuration substantially identical with that described in Embodiment 2 with reference to FIG. 5, except that the third reflection enhancing film layer is provided which includes the second electrode 12 that is a transparent electrode.

As illustrated in FIG. 9, a layer 13 having the third reflection enhancing film layer includes (i) an insulating layer 11 which causes visible light to pass through and (ii) the second electrode 12 that is a transparent electrode. A refractive index of a contact film in the insulating layer 11, which contact film makes contact with the second electrode 12, is different from that of the second electrode 12. Moreover, the refractive index of the second electrode 12 is higher than that of the contact film.

Note that, in the insulating layer 11, each two films, which do not include the contact film, have respective refractive indexes such that a refractive index of an upper one of the two films is higher than that of a lower one of the two films, and the each two films constitute a reflection enhancing film layer.

FIG. 9 illustrates the case in which the insulating layer 11 is provided as a lower layer with respect to the second electrode 12. Note, however, that the insulating layer 11 can be provided as an upper layer with respect to the second electrode 12.

In such a case, a contact film in the insulating layer 11 which contact film makes contact with the second electrode 12 has a refractive index which is higher than that of the second electrode 12.

Figure 10:
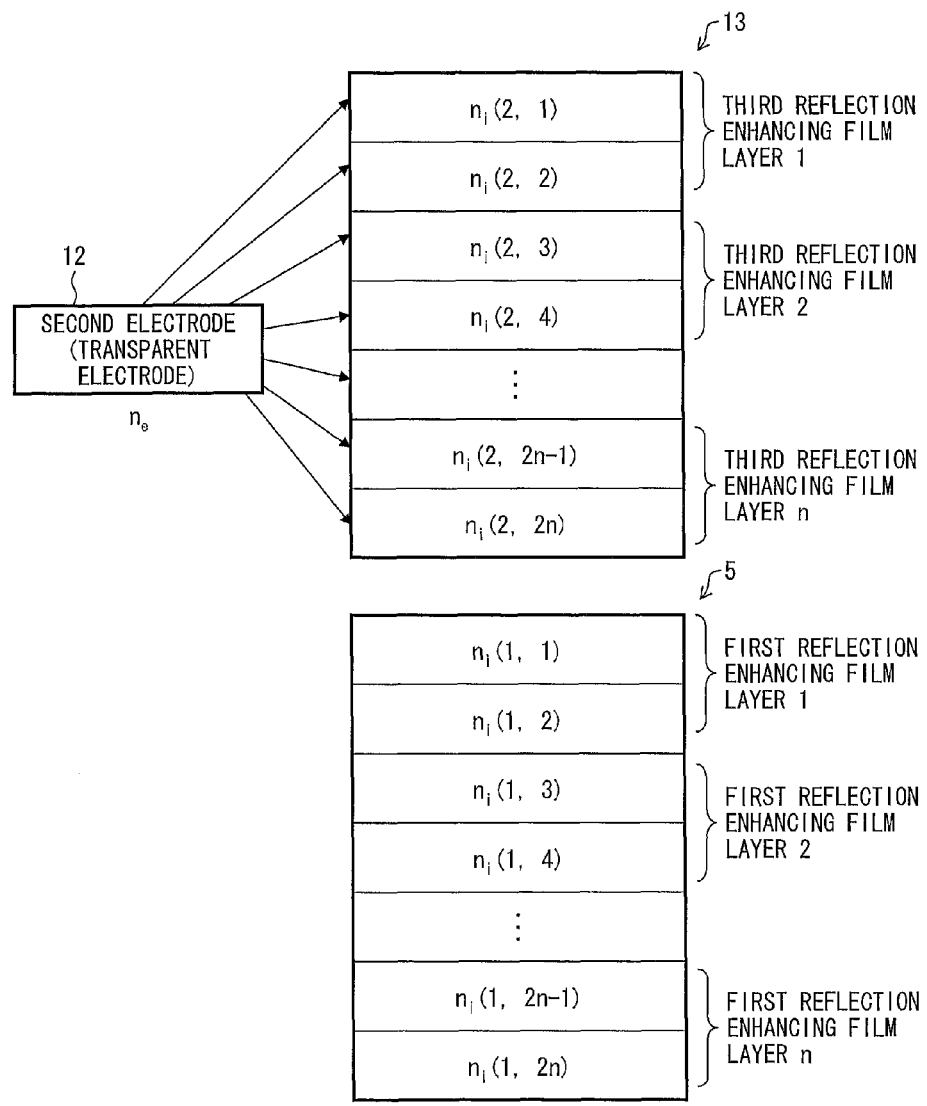
FIG. 10 is a view illustrating a configuration of a layer that has a third reflection enhancing film layer which is used in the lateral electric field liquid crystal display device illustrated in FIG. 9.

FIG. 10 is a view illustrating a configuration of the layer 13 that has the third reflection enhancing film layer which is used in the lateral electric field liquid crystal display device 1e illustrated in FIG. 9.

The following describes the configuration of the layer 13 that has the third reflection enhancing film layer illustrated in FIG. 9, with reference to FIG. 10. In FIG. 10, an uppermost film in the layer 13 is the second electrode 12, and the other films in the layer 13 serve as the insulating layer 11.

Moreover, a refractive index $n_e$ of the second electrode 12 is higher than a refractive index $n_i(2, 2)$ of a contact film in the insulating layer 11 which contact film makes contact with the second electrode 12.

Note that, in the insulating layer 11, lower ones of every two films, which do not include the contact film, have respective refractive indexes $n_i(2, 4), \ldots,$ and $n_i(2, 2n)$ which are lower than respective refractive indexes $n_i(2, 3), \ldots,$ and $n_i(2, 2n-1)$ of corresponding upper ones of the every two films. As such, the upper and lower ones of each two films constitute a reflection enhancing film layer.

Note that the second electrode 12 is not limitedly provided as the uppermost film in the layer 13 as illustrated in FIG. 10, and the second electrode 12 can be provided as any of the films in the layer 13 illustrated in FIG. 10, provided that the relation of refractive index between upper and lower ones of each two films is satisfied so that a third reflection enhancing film layer is formed.

That is, a location at which the second electrode 12 is provided is determined based on the refractive index $n_e$ of the second electrode 12. In a case where the refractive index $n_e$ is higher than, for example, a refractive index $n_i(2, 2n)$, a third reflection enhancing film layer can be formed by providing the second electrode 12 having the refractive index $n_e$ as any of insulating films having, for example, the refractive index $n_i(2, 2n-1)$.

On the other hand, in a case where the refractive index $n_e$ is lower than, for example, the refractive index $n_i(2, 2n)$, a third reflection enhancing film layer can be formed by providing the second electrode 12 having the refractive index $n_e$ as any of insulating films having, for example, the refractive index $n_i(2, 2n)$.

FIG. 10 illustrates third reflection enhancing film layer 1, 2, ... or n. This indicates that a third reflection enhancing film layer can be formed at any location by providing the second electrode 12 at a specific location, and does not mean that a plurality of third reflection enhancing film layers can be formed.

The second electrode 12 is only one (1) layer, and accordingly only one (1) third reflection enhancing film layer including the second electrode 12 is formed. Each of the other reflection enhancing film layers is a first reflection enhancing film layer or a second reflection enhancing film layer.

Figure 11:
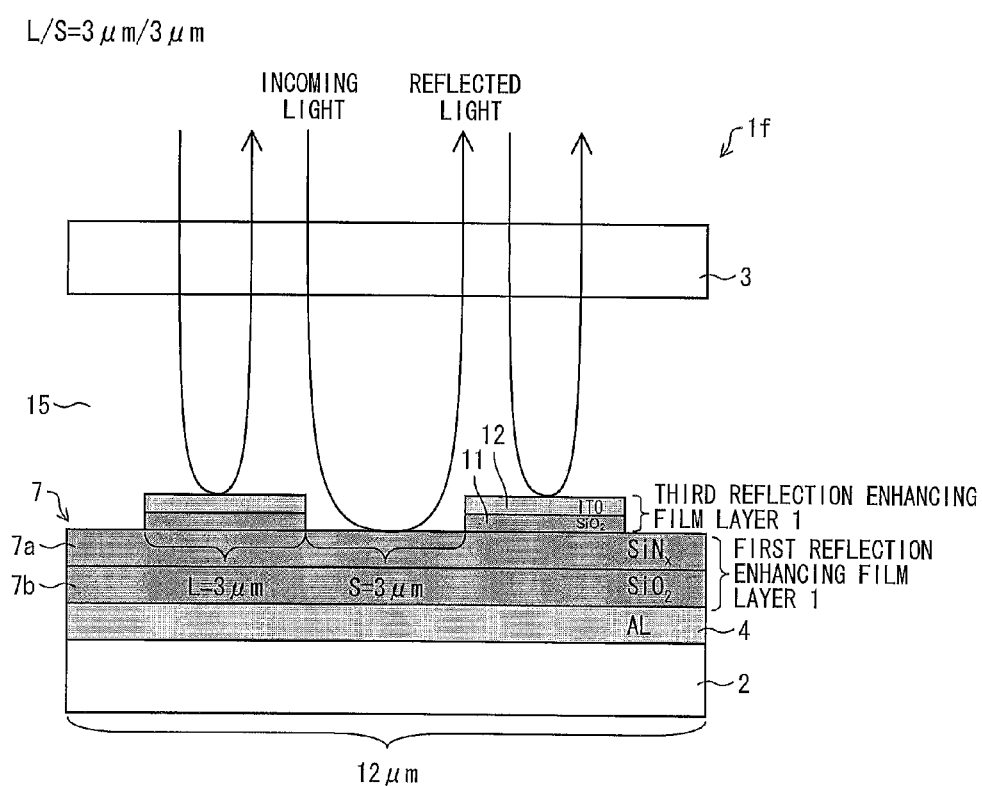
FIG. 11 is a view illustrating an example of a lateral electric field liquid crystal display device which includes a third reflection enhancing film layer that is made up of (i) an insulating layer formed by an $SiO_2$ film and (ii) a second electrode formed by an ITO film, in accordance with still another embodiment of the present invention.

A lateral electric field liquid crystal display device 1f illustrated in FIG. 11 is substantially identical with the lateral electric field liquid crystal display device 1a of Embodiment 1 illustrated in FIG. 4, except that, instead of the second electrode 6 made of Al, a third reflection enhancing film layer 1 is provided which is made up of (i) an insulating layer 11 that is an SiO$_2$ film having a refractive index of 1.47 (for 550 nm) and (ii) a second electrode 12 that is an ITO film having a refractive index of 2.01 (for 550 nm).

Figure 12:
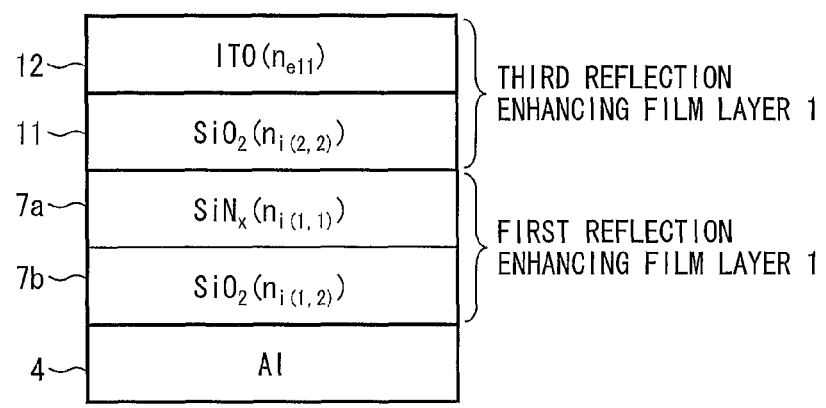
FIG. 12 is a view schematically illustrating a configuration of (i) a first reflection enhancing film layer which is provided on a first electrode formed by Al and (ii) a third reflection enhancing film layer, in the lateral electric field liquid crystal display device illustrated in FIG. 11.

FIG. 12 is a view schematically illustrating a configuration of (i) a first reflection enhancing film layer 1 which is provided on a first electrode 4 formed by Al and (ii) a third reflection enhancing film layer 1, in the lateral electric field liquid crystal display device 1f illustrated in FIG. 11.

As illustrated in FIG. 12, the first insulating layer 7 is made up of a second film 7a (upper layer) and a first film 7b (lower layer), and the second film 7a and the first film 7b constitute a first reflection enhancing film layer 1.

The first film 7b is an SiO$_2$ film having a refractive index $n_i(1, 2)$ of 1.47 (for 550 nm). The second film 7a is an SiNx film having a refractive index $n_i(1, 1)$ of 2.03 (for 550 nm).

Further, the third reflection enhancing film layer 1 is provided on the first reflection enhancing film layer 1. The third reflection enhancing film layer 1 is made up of (i) an insulating layer 11 which is a lower layer and is an SiO$_2$ film having a refractive index of 1.47 (for 550 nm) and (ii) a second electrode 12 which is an upper layer and is an ITO film having a refractive index of 2.01 (for 550 nm).

According to the present embodiment, the SiO$_2$ film has the refractive index of 1.47, the SiNx film has the refractive index of 2.03, and the ITO film has the refractive index of 2.01. Note, however, that the present embodiment is not limited to this and the SiO$_2$ film can have a refractive index falling within a range between 1.3 and 1.7, the SiNx film can have a refractive index falling within a range between 1.8 and 2.2, and the ITO film can have a refractive index falling within a range between 1.8 and 2.2.

The following description will discuss calculated optimal film thicknesses of the insulating layer 11 which is an SiO$_2$ film and a second electrode 12 which is an ITO film, with reference to the lateral electric field liquid crystal display device 1f configured as illustrated in FIG. 11.

In an area (S) in which the first insulating layer 7 is formed, only the first insulating layer 7 serves as a reflection enhancing film and, in an area (L) in which the second electrode 12 is formed, not only the first insulating layer 7 but also a combination of the second electrode 12 and the insulating layer 11 serve as reflection enhancing films (see FIG. 11).

According to the configuration, a reflectance in the area (L) is different from that of the area (S), and therefore the reflectances need to be calculated respectively.

Tables 6, 7, and 8 below show optimum conditions of the film thicknesses of the insulating layer 11 and the second electrode 12 for highest reflectance and chromaticity in the area (L) in which the second electrode 12 is formed.

Note that "$\lambda/4$" is an optical film thickness which is expressed by a product nd of a refractive index n and a film thickness d. Moreover, "$\lambda$" is a setting wavelength and is assumed to be 550 nm in the calculation. While changing the optical film thickness by modifying values of a and b, the optimal reflectance and chromaticity are calculated.

Moreover, the film thickness of the SiO$_2$ film is fixed to 840 Å (i.e., the value a=0.9) and the film thickness of the SiNx film is fixed to 610 Å (i.e., the value b=0.9), where the values a and b are optimal ones obtained in Embodiment 1.

It is possible to obtain, from Tables 6 through 8 above, optimum conditions of reflectance in a case where, under the condition, the second electrode 12 is formed by ITO that has a refractive index of 2.01 (for 550 nm) and the insulating layer 11 is formed by SiO$_2$ having a refractive index of 1.47 (for 550 nm).

Each of the values a and b in the above tables indicates a magnification of a $\lambda/4$ wavelength.

Table 6 indicates values of reflectance (%). Table 7 indicates values of xy chromaticity coordinates. Table 8 indicates $\Delta xy$ chromaticity differences from xy coordinates (i.e., x=0.3111, y=0.3284) of a simple substance Al.

From the results shown in Table 6, the reflectance is highest (i.e., 93.37%) when the value a is 1.8 (i.e., 1700 Å) and the value b is 0.3 (i.e., 200 Å).

However, with regard to an electrode made of ITO, a film thickness equal to or smaller than 500 Å is not realistic, and if

TABLE 6

| *Refl. (%) | b | a SiO$_2$ ($\lambda/4 \times a$) | | | | | | |
|---|---|---|---|---|---|---|---|---|
| | | 0 | 0.3 | 0.6 | 0.9 | 1.2 | 1.5 | 1.8 |
| ITO ($\lambda/4 \times b$) | 0.3 | 93.00% | 90.27% | 88.98% | 90.07% | 91.93% | 93.28% | 93.37% |
| | 0.6 | 90.27% | 85.57% | 86.25% | 89.47% | 92.13% | 93.30% | 92.19% |
| | 0.9 | 85.69% | 83.14% | 86.63% | 90.25% | 92.33% | 92.38% | 89.65% |
| | 1.2 | 82.49% | 83.78% | 87.72% | 90.32% | 91.15% | 89.82% | 86.49% |
| | 1.5 | 82.50% | 85.02% | 87.48% | 88.45% | 87.97% | 86.19% | 84.21% |

*Refl.: Reflectance

TABLE 7

| *xy C.C. | b | a SiO$_2$ ($\lambda/4 \times a$) | | | | | | |
|---|---|---|---|---|---|---|---|---|
| | | 0 | 0.3 | 0.6 | 0.9 | 1.2 | 1.5 | 1.8 |
| ITO ($\lambda/4 \times b$) | 0.3 | 0.3171/0.3378 | 0.3239/0.3438 | 0.3126/0.3285 | 0.3089/0.3265 | 0.3090/0.3286 | 0.3130/0.3356 | 0.3176/0.3401 |
| | 0.6 | 0.3239/0.3436 | 0.3160/0.3283 | 0.3070/0.3239 | 0.3060/0.3280 | 0.3099/0.3327 | 0.3183/0.3453 | 0.3222/0.3421 |
| | 0.9 | 0.3225/0.3345 | 0.3085/0.3228 | 0.3044/0.3254 | 0.3079/0.3306 | 0.3154/0.3418 | 0.3228/0.3479 | 0.3227/0.3344 |
| | 1.2 | 0.3146/0.3261 | 0.3056/0.3267 | 0.3084/0.3331 | 0.3147/0.3406 | 0.3212/0.3465 | 0.3235/0.3404 | 0.3208/0.3281 |
| | 1.5 | 0.3102/0.3301 | 0.3115/0.3389 | 0.3174/0.3447 | 0.3213/0.3444 | 0.3222/0.3389 | 0.3216/0.3332 | 0.3190/0.3324 |

*xy C.C.: xy chromaticity coordinates

TABLE 8

| $\Delta xy$ (Al Center) | b | a SiO$_2$ ($\lambda/4 \times a$) | | | | | | |
|---|---|---|---|---|---|---|---|---|
| | | 0 | 0.3 | 0.6 | 0.9 | 1.2 | 1.5 | 1.8 |
| ITO ($\lambda/4 \times b$) | 0.3 | 0.01115 | 0.02002 | 0.00150 | 0.00291 | 0.00211 | 0.00745 | 0.01339 |
| | 0.6 | 0.02002 | 0.00490 | 0.00609 | 0.00564 | 0.00446 | 0.01837 | 0.01765 |
| | 0.9 | 0.01293 | 0.00617 | 0.00734 | 0.00388 | 0.01407 | 0.02274 | 0.01302 |
| | 1.2 | 0.00419 | 0.00578 | 0.00542 | 0.01272 | 0.02073 | 0.01726 | 0.00972 |
| | 1.5 | 0.00192 | 0.01051 | 0.01748 | 0.01897 | 0.01528 | 0.01155 | 0.00885 |

As a precondition, in the area (L) in which the second electrode 12 is provided, the first insulating layer 7 is made up of a first film 7a which is an SiO$_2$ film having a refractive index of 1.47 (for 550 nm) and a second film 7a which is an SiNx film having a refractive index of 2.03 (for 550 nm).

the value b is 0.3 (i.e., 200 Å), the electrode can have a problem. Therefore, the film thickness of the ITO film is preferably 500 Å or more.

From the results shown in Tables 6 through 8, in a case where the value a is 1.2 (i.e., 1100 Å) and the value b is 0.9

(i.e., 610 Å), the reflectance is highest and the chromaticity difference is smallest with the ITO film having the film thickness of 500 Å or more. In this case, the reflectance is 92.33%, and the chromaticity difference from that of Al is 0.01407.

An optimal range of the values a and b obtained based on Tables 6 through 8 can be 0.9 (i.e., 840 Å)<a<1.8 (i.e., 1700 Å) and 0.3 (i.e., 200 Å)<b<1.2 (i.e., 820 Å), preferably 1.2 (i.e., 1100 Å)<a<1.8 (i.e., 1700 Å) and 0.6 (i.e., 410 Å)<b<1.2 (i.e., 820 Å), more preferably a=1.2 (i.e., 1100 Å) and b=0.9 (i.e., 610 Å).

Figure 13:
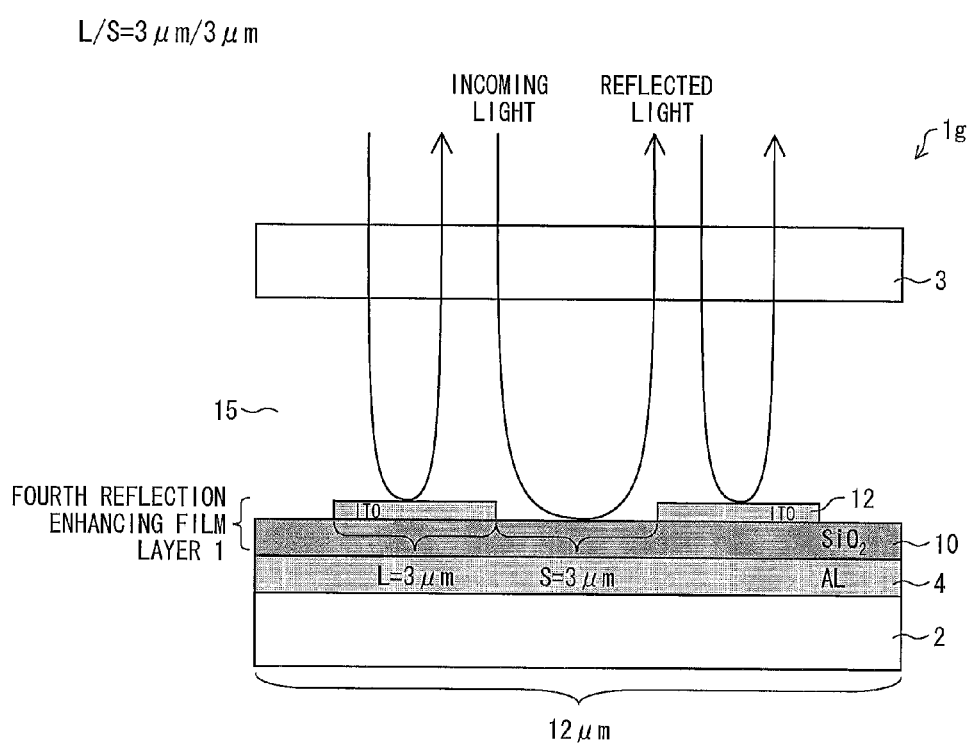
FIG. 13 is a view illustrating an example of a conventional lateral electric field liquid crystal display device which includes a fourth reflection enhancing film layer that is made up of an insulating layer formed by one (1) $SiO_2$ film and a second electrode formed by ITO.

For comparison, the following description will discuss optimal film thicknesses of an insulating layer 10 and a second electrode 12, which film thicknesses are calculated with reference to a schematic configuration of a conventional lateral electric field liquid crystal display device 1g which is of a reflection type, utilizes FFS, and includes a fourth reflection enhancing film layer 1 made up of (i) the one (1) insulating layer 10 made of $SiO_2$ and (ii) the second electrode 12 made of ITO (see FIG. 13).

Tables 9, 10, and 11 below show optimum conditions of the film thicknesses of the insulating layer 10 and the second electrode 12 for most preferable reflectance and chromaticity in the area (L) in which the second electrode 12 is formed on the one (1) insulating layer 10 made of $SiO_2$ (i.e., the insulating layer 10 serves as a lower layer).

TABLE 9

| *Refl. (%) | | a $SiO_2$ ($\lambda/4 \times a$) | | | |
|---|---|---|---|---|---|
| | b | 0.6 | 0.9 | 1.2 | 1.5 |
| ITO | 0.3 | 84.34% | 87.25% | 89.29% | 89.65% |
| ($\lambda/4 \times b$) | 0.6 | 84.38% | 88.39% | 90.28% | 89.34% |
| | 0.9 | 86.26% | 89.38% | 90.02% | 86.69% |
| | 1.2 | 87.12% | 88.66% | 87.37% | 82.04% |
| | 1.5 | 85.59% | 85.21% | 82.51% | 78.30% |

*Refl.: Reflectance

TABLE 10

| *xy | | a $SiO_2$ ($\lambda/4 \times a$) | | | |
|---|---|---|---|---|---|
| C.C. | b | 0.6 | 0.9 | 1.2 | 1.5 |
| ITO | 0.3 | 0.3104/0.3277 | 0.3088/0.3266 | 0.3097/0.3280 | 0.3140/0.3341 |
| ($\lambda/4 \times b$) | 0.6 | 0.3070/0.3254 | 0.3081/0.3268 | 0.3115/0.3313 | 0.3220/0.3459 |
| | 0.9 | 0.3075/0.3272 | 0.3107/0.3306 | 0.3178/0.3407 | 0.3289/0.3494 |
| | 1.2 | 0.3121/0.3336 | 0.3177/0.3402 | 0.3256/0.3475 | 0.3264/0.3355 |
| | 1.5 | 0.3215/0.3453 | 0.3249/0.3449 | 0.3242/0.3362 | 0.3179/0.3253 |

*xy C.C.: xy chromaticity coordinates

TABLE 11

| Δxy | | a $SiO_2$ ($\lambda/4 \times a$) | | | |
|---|---|---|---|---|---|
| (Al Center) | b | 0.6 | 0.9 | 1.2 | 1.5 |
| ITO | 0.3 | 0.00099 | 0.00292 | 0.00146 | 0.00640 |
| ($\lambda/4 \times b$) | 0.6 | 0.00508 | 0.00340 | 0.00293 | 0.02062 |
| | 0.9 | 0.00379 | 0.00224 | 0.01401 | 0.02753 |
| | 1.2 | 0.00530 | 0.01352 | 0.02398 | 0.01687 |
| | 1.5 | 0.01984 | 0.02151 | 0.01525 | 0.00747 |

From the results shown in Table 9, the reflectance is highest (i.e., 90.28%) when the value a is 1.2 (i.e., 1100 Å) and the value b is 0.6 (i.e., 610 Å).

However, with regard to an electrode made of ITO, a film thickness equal to or smaller than 500 Å is not realistic, and if the value b is 0.3 (i.e., 200 Å), the electrode can have a problem.

Therefore, from the results shown in Tables 9 through 11, in a case where the value a is 1.2 (i.e., 1100 Å) and the value b is 0.9 (i.e., 610 Å), the reflectance is highest and the chromaticity difference is smallest with the ITO film having the film thickness of 500 Å or more. In this case, the reflectance is 90.02%, and the chromaticity difference from that of Al is 0.01401.

The following description will discuss comparison from the results shown in Tables 6 through 8. In Tables 6 through 8, the most preferable reflectance and chromaticity in the area (L) in which the second electrode 12 is formed are calculated in the case where the first insulating layer 7 is the first reflection enhancing film layer 1 (see FIG. 11). On the other hand, in Tables 9 through 11, the most preferable reflectance and chromaticity in the area (L) in which the second electrode 12 is formed are calculated in the case where only the one (1) insulating layer 10 made of $SiO_2$ is provided as a lower layer (see FIG. 13).

The comparison shows that, in the both cases, the reflectance is highest and the chromaticity difference is smallest when the value a is 1.2 (i.e., 1100 Å) and the value b is 0.9 (i.e., 610 Å). Here, the chromaticity differences are substantially identical with each other. Meanwhile, the reflectance of the configuration illustrated in FIG. 11 is 92.33%, which is higher than the reflectance (i.e., 90.02%) of the configuration illustrated in FIG. 13.

That is, although the color shift from the simple substance Al is substantially identical in both the cases illustrated in FIGS. 11 and 13, the reflectance of the configuration illustrated in FIG. 11 is higher by approximately 2.31% because the first reflection enhancing film layer 1 is provided in the configuration illustrated in FIG. 11.

Next, the reflectances are calculated (i) in the area (S) in which the first insulating layer 7 is formed in the configuration of FIG. 11 and (ii) in the area (S) in which the insulating film 10 is formed in the configuration of FIG. 13.

The reflectance in the area (S) in which the first insulating layer 7 is formed in the configuration of FIG. 11 is identical with that of the result shown in Table 1 of Embodiment 1. Meanwhile, the reflectance in the area (S) in which the insulating film 10 is formed in the configuration of FIG. 13 is 88.82%, as a result of calculation in which the value a is set to 1.2, which is identical with the optimal value a of $SiO_2$ in Table 9, because the insulating film 10 is the only one $SiO_2$ film.

Table 12 below shows reflectances of the entire pixel which are calculated based on the above results.

TABLE 12

| | L-reflectance | S-reflectance | Reflectance of entire pixel | Reflection enhancing ratio (%) | Δxy chromaticity difference of L | Δxy chromaticity difference of S |
|---|---|---|---|---|---|---|
| 1 fourth reflection enhancing layer ($SiO_2$ + ITO) (a = 1.2, b = 0.9) Configuration of FIG. 13 | 90.02% | 88.82% | 89.42% | — | 0.01401 | 0.00042 |
| 1 third reflection enhancing layer ($SiO_2$ + ITO) (a = 1.2, b = 0.9), 1 first reflection enhancing layer ($SiO_2$ + SiNx) (a = 0.9, b = 0.9) Configuration of FIG. 11 | 92.33% | 93.56% | 92.94% | 4.8 | 0.01407 | 0.00215 |
| 1 third reflection enhancing layer ($SiO_2$ + ITO) (a = 1.2, b = 0.9), 2 first reflection enhancing layers ($SiO_2$ + SiNx) (a = 0.9, b = 0.9) | 92.66% | 95.86% | 94.26% | 6.3 | 0.01299 | 0.00331 |
| 1 third reflection enhancing layer ($SiO_2$ + ITO) (a = 1.2, b = 0.9), 3 first reflection enhancing layers ($SiO_2$ + SiNx) (a = 0.9, b = 0.9) | 92.08% | 96.57% | 94.33% | 6.3 | 0.01305 | 0.00508 |

In Table 12, the uppermost case is a configuration illustrated in FIG. 13 in which only an insulating layer 10, which is one (1) $SiO_2$ film, is provided, and the insulating layer 10 and a second electrode 12 constitute a fourth reflection enhancing film layer; a case below is a configuration illustrated in FIG. 11 in which one (1) third reflection enhancing film layer and one (1) first reflection enhancing film layer are provided; and the subsequent two cases below respectively are (i) a case in which two first reflection enhancing film layers are provided and (ii) a case in which three first reflection enhancing film layers are provided.

As shown in Table 12, the reflectance of the entire pixel in the configuration illustrated in FIG. 11 is higher by 4.8% than the reflectance of the entire pixel in the configuration illustrated in FIG. 13. As the number of first reflection enhancing film layers is increased to two and three, the reflectance of the entire pixel is increased. However, cost is also increased, and it is therefore preferable to provide one (1) first reflection enhancing film layer.

[Embodiment 4]

Figure 14:
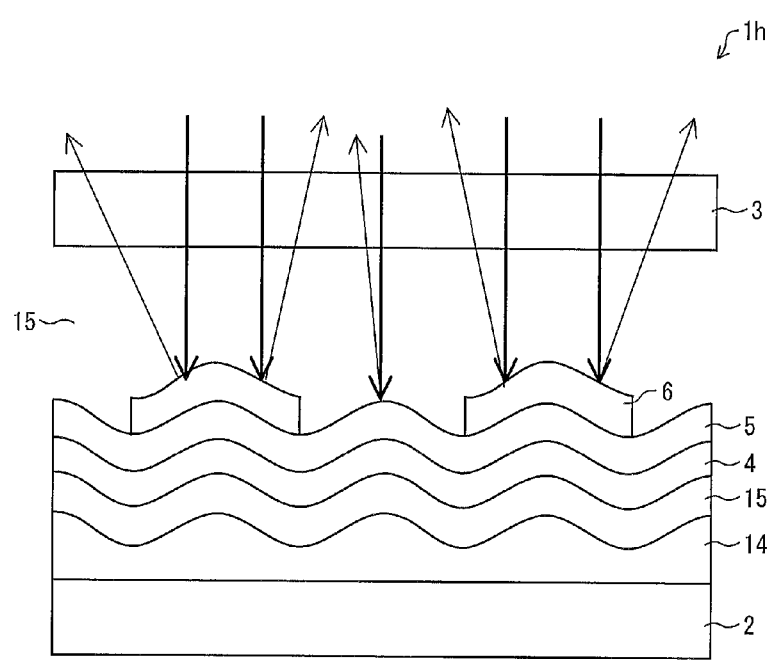
FIG. 14 is a view schematically illustrating a configuration of a lateral electric field liquid crystal display device which includes a scattering layer, in accordance with yet another embodiment of the present invention.
Figure 15:
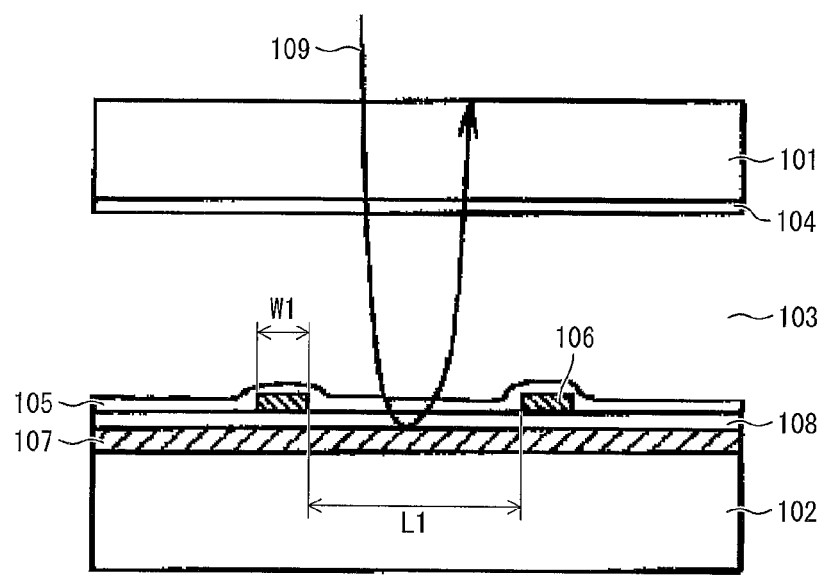
FIG. 15 is a view schematically illustrating a configuration of a lateral electric field liquid crystal display device of Patent Literature 1, which is of a reflection type and utilizes FFS.

The following description will discuss Embodiment 4 of the present invention with reference to FIG. 14. The present embodiment is different from Embodiments 1 through 3 in that a scattering layer 14 is provided under a first electrode 4 so as to enhance scattering of reflected light. The other configurations are identical with those described in Embodiments 1 through 3. For convenience, identical reference numerals are given to constituent members having functions identical with those of the constituent members illustrated in the drawings of Embodiments 1 through 3, and descriptions of such constituent members are omitted here.

A lateral electric field liquid crystal display device 1h illustrated in FIG. 14 is configured by adding a scattering layer 14 to the lateral electric field liquid crystal display device 1 which has been described in Embodiment 1 with reference to FIG. 1.

By providing the scattering layer 14 under the first electrode 4 as illustrated in FIG. 14, it is possible to enhance scattering of reflected light. As such, it is possible to provide the lateral electric field liquid crystal display device 1h which can uniformly reflect incoming light at a reflectance higher than an original reflectance of a reflective electrode.

Moreover, an adhesive layer 15 can be provided between the first electrode 4 and the scattering layer 14 as appropriate.

By providing the adhesive layer 15, it is possible to improve adhesion between the first electrode 4 and the scattering layer 14.

A material of the scattering layer 14 is not limited to a particular one. For example, acrylic resin or the like can be shaped in a film having an uneven surface.

A material of the adhesive layer 15 is not limited to a particular one provided that a favorable adhesion can be secured between the scattering layer 14 and the first electrode 4. For example, the adhesive layer 15 can be made of Mo or IZO.

Although not illustrated, the configuration in which the scattering layer 14 is provided under the first electrode 4 in order to enhance scattering of reflected light can be applied to any of Embodiments 1 through 3.

(Main Points)

In order to attain the object, the active matrix substrate of the present invention includes: an insulating substrate; a first electrode provided on the insulating substrate; a first insulating layer formed so as to cover the first electrode; and a plurality of second electrodes provided on the first insulating layer, each of the plurality of second electrodes being a plurality of linear electrodes which are arranged at predetermined intervals and are electrically connected to each other, a lateral electric field being applied between the first electrode and the plurality of second electrodes, the first electrode being made of a material having an electrical conductivity and a reflectiveness, and each of the plurality of second electrodes being made of a material having an electrical conductivity, the first insulating layer including at least one first reflection enhancing layer which is made up of a first film and a second film which (i) have respective different refractive indexes, (ii) cause visible light to pass through, and (iii) are respective of a lower layer and an upper layer that are adjacent to each other, the lower layer being closer to the insulating substrate than the upper layer is, and in each of the at least one first reflection enhancing layer, the first film having a refractive index lower than a refractive index of the second film.

According to the configuration, the first insulating layer includes the at least one first reflection enhancing layer which is made up of the first film and the second film which are adjacent to each other.

Each of the at least one first reflection enhancing layer serves as a reflection enhancing layer by combining light, which is reflected from a surface of the second film (i.e., the upper layer), with light reflected from a boundary surface between the second film and the first film (i.e., the lower layer).

As such, by the function of the at least one first reflection enhancing layer, it is possible to provide the active matrix substrate which can reflect incoming light at a reflectance higher than an original reflectance of the first electrode which is made of a material having an electrical conductivity and a reflectiveness.

According to the active matrix substrate of the present invention, it is preferable that the at least one first reflection enhancing layer included in the first insulating layer is a plurality of first reflection enhancing layers.

According to the configuration, the first insulating layer includes the plurality of first reflection enhancing layers. This allows a further improvement in reflection enhancing effect. It is therefore possible to provide the active matrix substrate which can reflect incoming light at a reflectance higher than an original reflectance of the first electrode which is made of a material having an electrical conductivity and a reflectiveness.

According to the active matrix substrate of the present invention, it is preferable that the at least one first reflection enhancing layer included in the first insulating layer is one (1) first reflection enhancing layer.

According to the configuration, the first insulating layer includes the one (1) first reflection enhancing layer. It is therefore possible to provide the active matrix substrate which can reflect incoming light at a reflectance higher than an original reflectance of the first electrode which is made of a material having an electrical conductivity and a reflectiveness, without greatly increasing the number of steps in manufacturing the active matrix substrate.

According to the active matrix substrate of the present invention, it is preferable that the first films, which are included in the respective plurality of first reflection enhancing layers, are made of an identical material, and the second films, which are included in the respective plurality of first reflection enhancing layers, are made of another identical material that is different from the material of the first films.

According to the configuration, in the plurality of first reflection enhancing layers, the first films are made of the identical material and the second films are made of another identical material that is different from the material of the first films.

This allows the plurality of first reflection enhancing layers to be formed, in manufacturing the active matrix substrate, by repeatedly carrying out a formation of the first film and a formation of the second film.

It is therefore possible to provide, relatively easily and at low cost, the active matrix substrate which can reflect incoming light at a reflectance higher than an original reflectance of the first electrode which is made of a material having an electrical conductivity and a reflectiveness.

According to the active matrix substrate of the present invention, in each of the at least one first reflection enhancing layer, it is preferable that the first film is made of silicon oxide and the second film is made of silicon nitride.

According to the configuration, each of the at least one first reflection enhancing layer is made up of a silicon oxide film and a silicon nitride film which are relatively dense materials. This makes it possible to provide the active matrix substrate which has high reliability.

According to the active matrix substrate of the present invention, it is preferable that, in each of the at least one first reflection enhancing layer, the first film is made of silicon oxide and the second film is made of silicon nitride; the first film has a film thickness of 280 Å or larger and 1100 Å or smaller; and the second film has a film thickness of 200 Å or larger and 810 Å or smaller.

According to the configuration, the silicon oxide film and the silicon nitride film, which constitute each of the at least one first reflection enhancing layer, have the respective predetermined film thicknesses. This makes it possible to provide the active matrix substrate which is higher in reflectance and can control color shift in reflected light.

In order to attain the object, the active matrix substrate of the present invention includes: an insulating substrate; a first electrode provided on the insulating substrate; a first insulating layer formed so as to cover the first electrode; and a plurality of second electrodes provided on the first insulating layer, each of the plurality of second electrodes being a plurality of linear electrodes which are arranged at predetermined intervals and are electrically connected to each other, a lateral electric field being applied between the first electrode and the plurality of second electrodes, the first electrode and each of the plurality of second electrodes being made of a material having an electrical conductivity and a reflectiveness, a second insulating layer being formed at least in an area in which each of the plurality of second electrodes is provided, the second insulating layer including at least one second reflection enhancing layer which is made up of a third film and a fourth film which (i) have respective different refractive indexes, (ii) cause visible light to pass through, and (iii) are respective of a lower layer and an upper layer that are adjacent to each other, the lower layer being closer to the insulating substrate than the upper layer is, and in each of the at least one second reflection enhancing layer, the third film having a refractive index lower than a refractive index of the fourth film.

According to the configuration, the second insulating layer is formed at least in an area in which each of the plurality of second electrodes, which are reflective electrodes, is provided, and the second insulating layer includes at least one second reflection enhancing layer which is made up of the third film and the fourth film which (i) have respective different refractive indexes and (ii) are respective of a lower layer and an upper layer that are adjacent to each other.

Each of the at least one second reflection enhancing layer serves as a reflection enhancing layer by combining light, which is reflected from a surface of the fourth film (i.e., the upper layer), with light reflected from a boundary surface between the fourth film and the third film which is the lower layer (i.e., the lower layer).

As such, by the function of the at least one second reflection enhancing layer, it is possible to provide the active matrix substrate which can reflect incoming light at a reflectance higher than an original reflectance of the first electrode and the plurality of second electrodes each of which is made of a material having an electrical conductivity and a reflectiveness.

According to the active matrix substrate of the present invention, it is preferable that each of the plurality of second electrodes is made of a reflective material; a second insulating layer is formed at least in an area in which each of the plurality of second electrodes is provided; the second insulating layer includes at least one second reflection enhancing layer which is made up of a third film and a fourth film which (i) have respective different refractive indexes, (ii) cause visible light to pass through, and (iii) are respective of a lower layer and an upper layer that are adjacent to each other, the lower layer being closer to the insulating substrate than the upper layer is;

and in each of the at least one second reflection enhancing layer, the third film has a refractive index lower than a refractive index of the fourth film.

According to the configuration, by the functions of the at least one first reflection enhancing layer and the at least one second reflection enhancing layer, it is possible to provide the active matrix substrate which can reflect incoming light at a reflectance higher than an original reflectance of the first electrode and the plurality of second electrodes each of which is made of a material having an electrical conductivity and a reflectiveness.

According to the active matrix substrate of the present invention, the at least one second reflection enhancing layer included in the second insulating layer is a plurality of second reflection enhancing layers.

According to the configuration, the second insulating layer includes the plurality of second reflection enhancing layers. It is therefore possible to further improve the reflection enhancing effect. It is therefore possible to provide the active matrix substrate which can reflect incoming light at a reflectance higher than an original reflectance of the first electrode and the plurality of second electrodes each of which is made of a material having an electrical conductivity and a reflectiveness.

According to the active matrix substrate of the present invention, it is preferable that the at least one second reflection enhancing layer included in the second insulating layer is one (1) second reflection enhancing layer.

According to the configuration, the second insulating layer includes the one (1) second reflection enhancing layer. It is therefore possible to provide the active matrix substrate which can reflect incoming light at a reflectance higher than an original reflectance of the first electrode and the plurality of second electrodes each of which is made of a material having an electrical conductivity and a reflectiveness, without greatly increasing the number of steps in manufacturing the active matrix substrate.

According to the active matrix substrate of the present invention, it is preferable that the third films, which are included in the respective plurality of second reflection enhancing layers, are made of an identical material, and the fourth films, which are included in the respective plurality of second reflection enhancing layers, are made of another identical material that is different from the material of the third films.

According to the configuration, in the plurality of second reflection enhancing layers, the third films are made of the identical material and the fourth films are made of another identical material that is different from the material of the third films.

This allows the plurality of second reflection enhancing layers to be formed, in manufacturing the active matrix substrate, by repeatedly carrying out a formation of the third film and a formation of the fourth film.

It is therefore possible to provide, relatively easily and at low cost, the active matrix substrate which can reflect incoming light at a reflectance higher than an original reflectance of the first electrode and the plurality of second electrodes each of which is made of a material having an electrical conductivity and a reflectiveness.

According to the active matrix substrate of the present invention, it is preferable that, in each of the at least one second reflection enhancing layer, the third film is made of silicon oxide and the fourth film is made of silicon nitride.

According to the configuration, each of the at least one second reflection enhancing layer is made up of a silicon oxide film and a silicon nitride film which are relatively dense materials. This makes it possible to provide the active matrix substrate which has high reliability.

According to the active matrix substrate of the present invention, it is preferable that, in the reflection enhancing layer, the third film is made of silicon oxide and the fourth film is made of silicon nitride; the third film has a film thickness of 280 Å or larger and 1100 Å or smaller; and the fourth film has a film thickness of 200 Å or larger and 810 Å or smaller.

According to the configuration, the silicon oxide film and the silicon nitride film, which constitute each of the at least one second reflection enhancing layer, have the respective predetermined film thicknesses. This makes it possible to provide the active matrix substrate which is higher in reflectance and can control color shift in reflected light.

In order to attain the object, the active matrix substrate of the present invention includes: an insulating substrate; a first electrode provided on the insulating substrate; a first insulating layer formed so as to cover the first electrode; and a plurality of second electrodes provided on the first insulating layer, each of the plurality of second electrodes being a plurality of linear electrodes which are arranged at predetermined intervals and are electrically connected to each other, a lateral electric field being applied between the first electrode and the plurality of second electrodes, the first electrode being made of a material having an electrical conductivity and a reflectiveness, and each of the plurality of second electrodes being made of a material having an electrical conductivity and causing visible light to pass through, a third insulating layer being provided on each of the plurality of second electrodes as an upper layer or as a lower layer with respect to the second electrode, the third insulating layer causing visible light to pass through, the third insulating layer being made up of (i) a contact film that makes contact with the second electrode and (ii) at least one third reflection enhancing layer which is made up of two films that have respective different refractive indexes and are adjacent to each other; in a case where the third insulating layer is provided as the lower layer with respect to the second electrode, the second electrode being made of a material whose refractive index is higher than a refractive index of a material of the contact film that makes contact with the second electrode; and in a case where the third insulating layer is provided as the upper layer with respect to the second electrode, the second electrode being made of a material whose refractive index is lower than a refractive index of a material of the contact film that makes contact with the second electrode.

According to the configuration, by the functions of (i) the reflection enhancing layer made up of the second electrode and the contact film and (ii) the at least one third reflection enhancing layer, it is possible to provide the active matrix substrate which can reflect incoming light at a reflectance higher than an original reflectance of the first electrode which is made of a material having an electrical conductivity and a reflectiveness.

According to the active matrix substrate of the present invention, it is preferable that a scattering layer having an uneven surface is provided between the insulating substrate and the first electrode.

According to the configuration, the scattering layer having the uneven surface is provided under the first electrode. Accordingly, an upper layer on the scattering layer is also to have an uneven surface, and this allows incoming light to be scattered by reflection.

It is therefore possible to provide the active matrix substrate which can uniformly reflect incoming light at a reflectance higher than an original reflectance of a reflective electrode.

The present invention is not limited to the embodiments, but can be altered by a skilled person in the art within the scope of the claims. An embodiment derived from a proper combination of technical means disclosed in respective different embodiments is also encompassed in the technical scope of the present invention.

Industrial Applicability

The present invention is suitably applicable to a field of a device such as a liquid crystal display device.

Reference Signs List

1: Lateral electric field liquid crystal display device
1a, 1b, 1c, 1d: Lateral electric field liquid crystal display device
1e, 1f, 1h: Lateral electric field liquid crystal display device
2: Insulating substrate
3: Counter substrate
4: First electrode
5: First insulating layer
6: Second electrode
7: First insulating layer
7a: Second film
7b: First film
8: Second insulating layer
9: Second insulating layer
10: Insulating layer
11: Insulating layer
12: Second electrode 12
13: Layer having a third reflection enhancing film layer
14: Scattering layer
15: Adhesive layer

The invention claimed is:
1. An active matrix substrate comprising:
an insulating substrate;
a first electrode provided on the insulating substrate;
a first insulating layer formed so as to cover the first electrode; and
a plurality of second electrodes provided on the first insulating layer,
each of the plurality of second electrodes being a plurality of linear electrodes which are arranged at predetermined intervals and are electrically connected to each other,
a lateral electric field being applied between the first electrode and the plurality of second electrodes,
the first electrode being made of a material having an electrical conductivity and a reflectiveness, and each of the plurality of second electrodes being made of a material having an electrical conductivity,
the first insulating layer including at least one first reflection enhancing layer which is made up of a first film and a second film which (i) have respective different refractive indexes, (ii) cause visible light to pass through, and (iii) are respective of a lower layer and an upper layer that are adjacent to each other, the lower layer being closer to the insulating substrate than the upper layer is,
in each of the at least one first reflection enhancing layer, the first film having a refractive index lower than a refractive index of the second film, each of the plurality of second electrodes is made of a reflective material;
a second insulating layer is formed only to cover the plurality of second electrodes is provided;
the second insulating layer includes at least one second reflection enhancing layer which is made up of a third film and a fourth film which (i) have respective different refractive indexes, (ii) cause visible light to pass through, and (iii) are respective of a lower layer and an upper layer that are adjacent to each other, the lower layer being closer to the insulating substrate than the upper layer is; and
in each of the at least one second reflection enhancing layer, the third film has a refractive index lower than a refractive index of the fourth film.

2. The active matrix substrate as set forth in claim 1, wherein: the at least one first reflection enhancing layer included in the first insulating layer is a plurality of first reflection enhancing layers.

3. The active matrix substrate as set forth in claim 1, wherein: the at least one first reflection enhancing layer included in the first insulating layer is one (1) first reflection enhancing layer.

4. The active matrix substrate as set forth in claim 2, wherein:
the first films, which are included in the respective plurality of first reflection enhancing layers, are made of an identical material, and the second films, which are included in the respective plurality of first reflection enhancing layers, are made of another identical material that is different from the material of the first films.

5. The active matrix substrate as set forth in claim 1, wherein:
in each of the at least one first reflection enhancing layer, the first film is made of silicon oxide and the second film is made of silicon nitride.

6. The active matrix substrate as set forth in claim 3, wherein:
in each of the at least one first reflection enhancing layer, the first film is made of silicon oxide and the second film is made of silicon nitride;
the first film has a film thickness of 280 Å or larger and 1100 Å or smaller; and
the second film has a film thickness of 200 Å or larger and 810 Å or smaller.

7. An active matrix substrate comprising:
an insulating substrate;
a first electrode provided on the insulating substrate;
a first insulating layer formed so as to cover the first electrode, the first insulating layer including at least one first reflection enhancing layer which is made up of a first film and a second film which (i) have respective different refractive indexes, (ii) cause visible light to pass through, and (iii) are respective of a lower layer and an upper layer that are adjacent to each other, the lower layer being closer to the insulating substrate than the upper layer is; and
a plurality of second electrodes provided on the first insulating layer,
each of the plurality of second electrodes being a plurality of linear electrodes which are arranged at predetermined intervals and are electrically connected to each other,
a lateral electric field being applied between the first electrode and the plurality of second electrodes,
the first electrode and each of the plurality of second electrodes being made of a material having an electrical conductivity and a reflectiveness,
a second insulating layer being formed only to cover the plurality of second electrodes is provided, the second insulating layer including at least one second reflection enhancing layer which is made up of a third film and a fourth film which (i) have respective different refractive indexes, (ii) cause visible light to pass through, and (iii) are respective of a lower layer and an upper layer that are adjacent to each other, the lower layer being closer to the insulating substrate than the upper layer is; and in each of the at least one first reflection enhancing layer, the first film having a refractive index lower than a refractive index of the fourth film.

8. The active matrix substrate as set forth in claim 7, wherein: the at least one second reflection enhancing layer included in the second insulating layer is a plurality of second reflection enhancing layers.

9. The active matrix substrate as set forth in claim 7, wherein: the at least one second reflection enhancing layer included in the second insulating layer is one (1) second reflection enhancing layer.

10. The active matrix substrate as set forth in claim 8, wherein: the third films, which are included in the respective plurality of second reflection enhancing layers, are made of an identical material, and the fourth films, which are included in the respective plurality of second reflection enhancing layers, are made of another identical material that is different from the material of the third films.

11. The active matrix substrate as set forth in claim 7, wherein:
in each of the at least one second reflection enhancing layer, the third film is made of silicon oxide and the fourth film is made of silicon nitride.

12. The active matrix substrate as set forth in claim 8, wherein:
in the reflection enhancing layer, the third film is made of silicon oxide and the fourth film is made of silicon nitride;
the third film has a film thickness of 280 Å or larger and 1100 Å or smaller; and
the fourth film has a film thickness of 200 Å or larger and 810 Å or smaller.

* * * * *